United States Patent
Dabral et al.

(10) Patent No.: US 10,742,217 B2
(45) Date of Patent: Aug. 11, 2020

(54) SYSTEMS AND METHODS FOR IMPLEMENTING A SCALABLE SYSTEM

(71) Applicant: Apple Inc., Cupertino, CA (US)

(72) Inventors: Sanjay Dabral, Cupertino, CA (US);
Bahattin Kilic, Cupertino, CA (US);
Jie-Hua Zhao, Cupertino, CA (US);
Kunzhong Hu, Cupertino, CA (US);
Suk-Kyu Ryu, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/266,604

(22) Filed: Feb. 4, 2019

(65) Prior Publication Data

US 2019/0319626 A1    Oct. 17, 2019

Related U.S. Application Data

(60) Provisional application No. 62/656,584, filed on Apr. 12, 2018.

(51) Int. Cl.
| | |
|---|---|
| *H03K 19/1776* | (2020.01) |
| *G06F 15/78* | (2006.01) |
| *H01L 23/31* | (2006.01) |
| *H05K 1/02* | (2006.01) |

(52) U.S. Cl.
CPC ..... *H03K 19/1776* (2013.01); *G06F 15/7807* (2013.01); *H01L 23/3114* (2013.01); *H05K 1/0298* (2013.01)

(58) Field of Classification Search
None
See application file for complete search history.

(56) References Cited

U.S. PATENT DOCUMENTS

| | | | |
|---|---|---|---|
| 5,781,258 A | 7/1998 | Dabral et al. | |
| 6,249,329 B1 | 6/2001 | Dabral et al. | |
| 8,183,651 B2* | 5/2012 | Takagi | B81C 1/00246 257/415 |
| 9,082,808 B2* | 7/2015 | Thacker | H01L 25/0652 |
| 9,837,391 B2* | 12/2017 | Khare | G06F 1/12 |
| 2005/0280138 A1* | 12/2005 | Shrivastava | H01L 23/4985 257/697 |
| 2008/0128897 A1* | 6/2008 | Chao | H01L 23/10 257/713 |
| 2013/0141442 A1* | 6/2013 | Brothers | G06T 1/20 345/502 |

(Continued)

FOREIGN PATENT DOCUMENTS

WO    2017099908 A1    6/2017

OTHER PUBLICATIONS

Intel, "Intel® 7500/7510/7512 Scalable Memory Buffer Datasheet", Document No. 322824-002, Apr. 2011, 40 pgs.

(Continued)

*Primary Examiner* — Crystal L Hammond
(74) *Attorney, Agent, or Firm* — Jaffery Watson Mendonsa & Hamilton LLP

(57) ABSTRACT

Multi-chip systems and structures for modular scaling are described. In some embodiments an interfacing bar is utilized to couple adjacent chips. For example, a communication bar may utilized to coupled logic chips, and memory bar may be utilized to couple multiple memory chips to a logic chip.

21 Claims, 26 Drawing Sheets

(56) References Cited

U.S. PATENT DOCUMENTS

| | | | |
|---|---|---|---|
| 2015/0091179 A1* | 4/2015 | Shenoy | H01L 23/5381 257/774 |
| 2016/0109668 A1* | 4/2016 | Pfnuer | G02B 6/428 385/3 |
| 2017/0062383 A1* | 3/2017 | Yee | H01L 25/0652 |

OTHER PUBLICATIONS

Schott Technical Glass Solutions GmbH, "BOROFLOAT® 33 & Glass Wafers: A Union of Inspiration & Quality", Germany, downloaded from the internet on Apr. 14, 2019, https://www.schott.com/d/borofloat/b8e85c79-374f-460b-a0e2-1cd2f4a41974/1.0/borofloat_wafer_db_row.pdf, created Jul. 31, 2015, modified Aug. 7, 2018, 4 pgs.

Set Corporation S.A., "FC 300 High Force Device Bonder", downloaded from the internet on Apr. 16, 2019, http://proxy.siteo.com.s3.amazonaws.com/www.set-sas.fr/image/imagebank/fc300.pdf, created/modified Aug. 8, 2013, France, 2 pgs.

Agilent Technologies, "Agilent W2630 Series DDR2 DRAM BGA Probes" Installation Guide, Fourth edition, Aug. 2013, 54 pgs.

Danskin, John et al., "PASCAL GPU WITH NVLINK", nVIDIA, Aug. 2016, 24 pgs.

Wikichip, "POWER9—Microarchitectures—IBM", Semiconductor & Computer Engineering, downloaded from the Internet on Apr. 16, 2019, https://en.wikichip.org/wiki/ibm/microarchitectures/power9, page created Jan. 31, 2017, lastest edit Jan. 17, 2019, 16 pgs.

Starke, W. J. et al., "The cache and memory subsystems of the IBM POWER8 processor", IBM Journal of Research and Development vol. 59 No. 1 Paper 3, Jan./Feb. 2015, 13 pgs.

SMI a SAES Group Company, Spectra-Mat, Inc., "Molybdenum-Copper Components" Product Bulletin, Watsonville, CA, Feb. 2014, 1 pg.

J D Global Trading Company, downloaded from the Internet on Apr. 15, 2019, http://www.jdtrade.net/us/molybdenum-copper, 2 pgs.

Shields Jr., John A., "Applications of Molybdenum Metal and its Alloys", International Molybdenum Association (IMOA), 2013, ISBN 978-1-907470-30-1, 2013, 44 pgs.

Mangroli, Alex et al., "Optimizing thermal and mechanical performance in PCBs", Global SMT & Packaging, Costa Mesa, CA, Dec. 2007, 3 pgs.

Arlon Electric Materials, "Epoxy Nonwoven Aramid Laminate and Prepreg", 45NK, Ver. 1.1, downloaded from the internet on Apr. 16, 2019, created Aug. 3, 2015, modified Mar. 7, 2016, http://www.arlonemd.com/wp-content/uploads/2016/03/45NK.pdf, 4 pgs.

Hruska, Joel, "Secrets of Nvidia Maxwell, Pascal power efficiency revealed in targeted testing" Aug. 2, 2016, https://www.extremetech.com/gaming/232771-targeted-testing-reveals-secrets-of-nvidia-maxwell-pascal-power-efficiency, 13 pgs.

Nowak, Ron et al., "Large Thin Organic PTFE Substrates for Multichip Applications.", 2005 Electronic Components and Technology Conference, Endicott, NY, pp. 1359-1363, 5 pgs. total.

Unknown Author, "High Density Interconnect chart", downloaded from the Internet on Apr. 16, 2019, https://www.flexiblecircuit.com/wp-content/uploads/2016/02/capabilities3.png, 1 pg.

International Search Report and Written Opinion for PCT/US2019/024647, dated Jun. 17, 2019, 14 pgs.

* cited by examiner

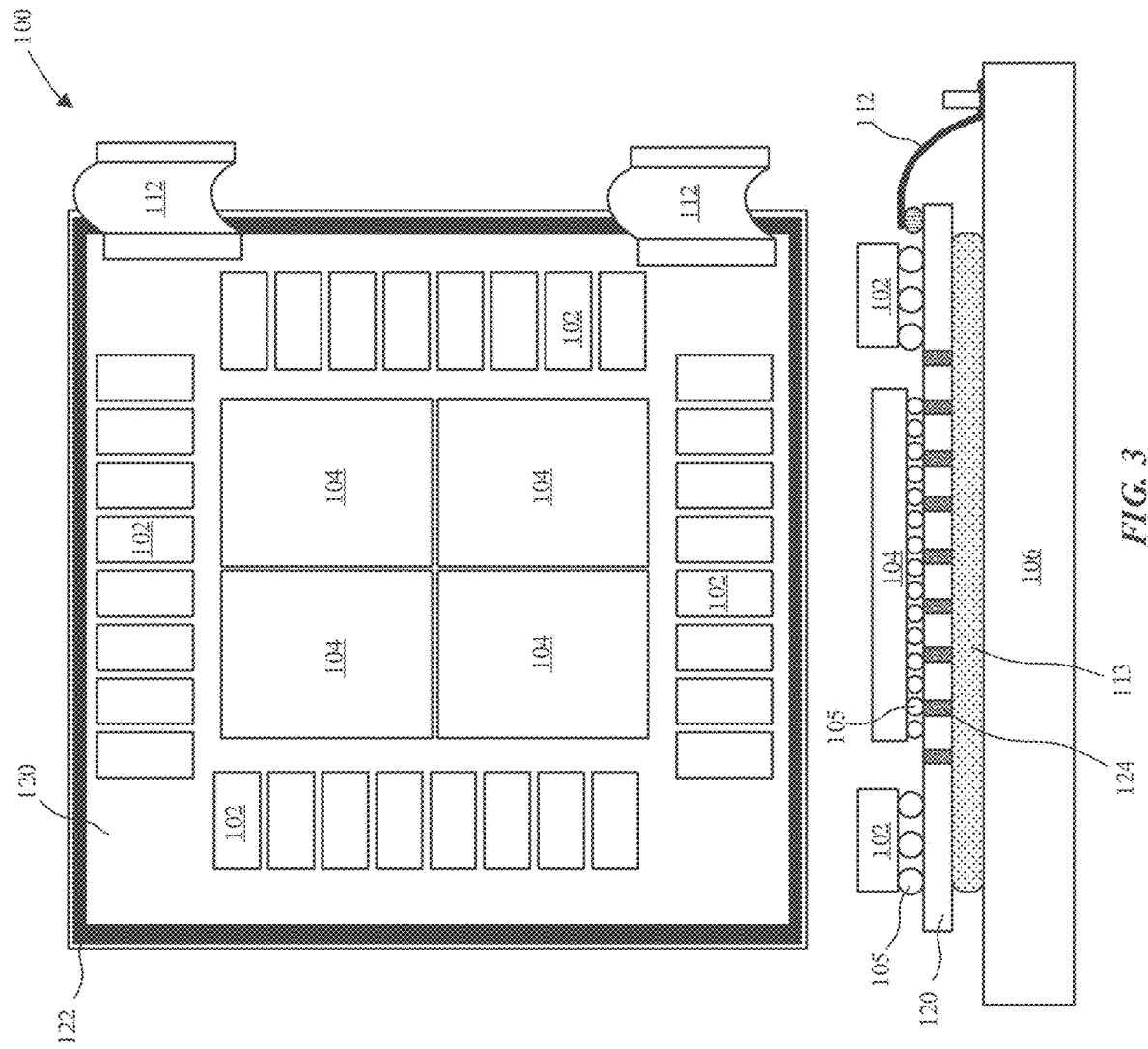

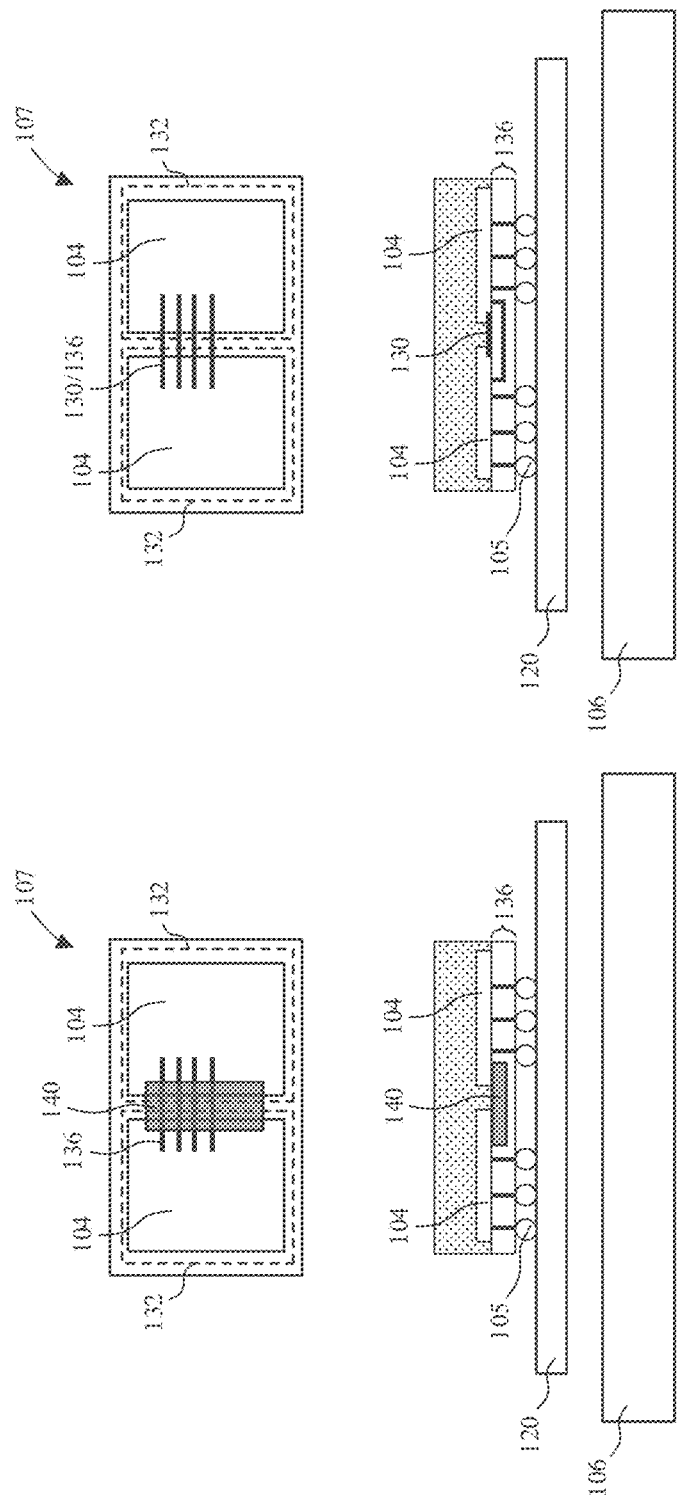

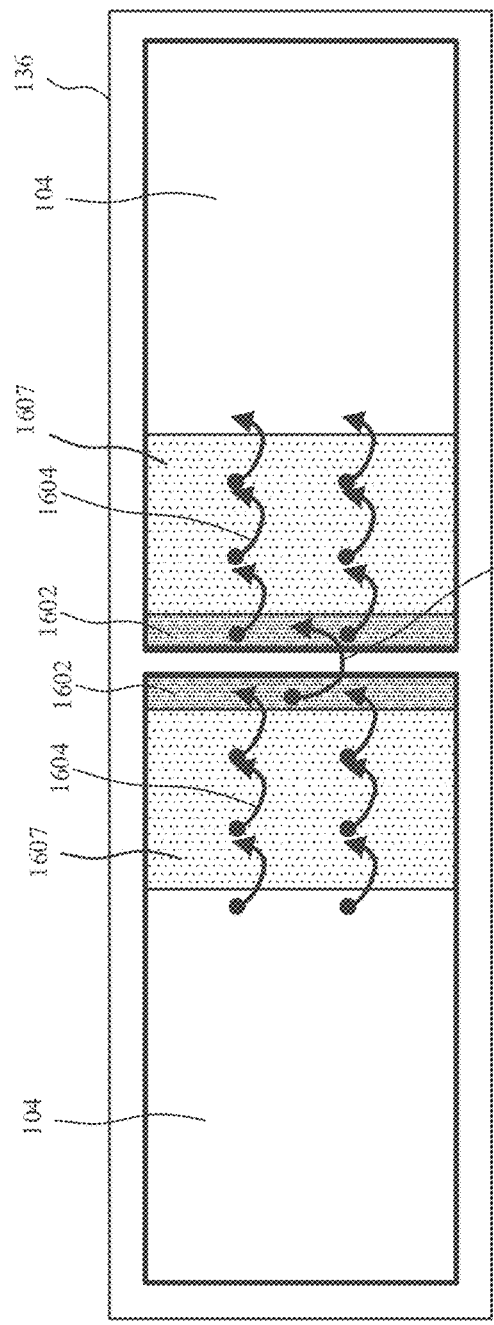
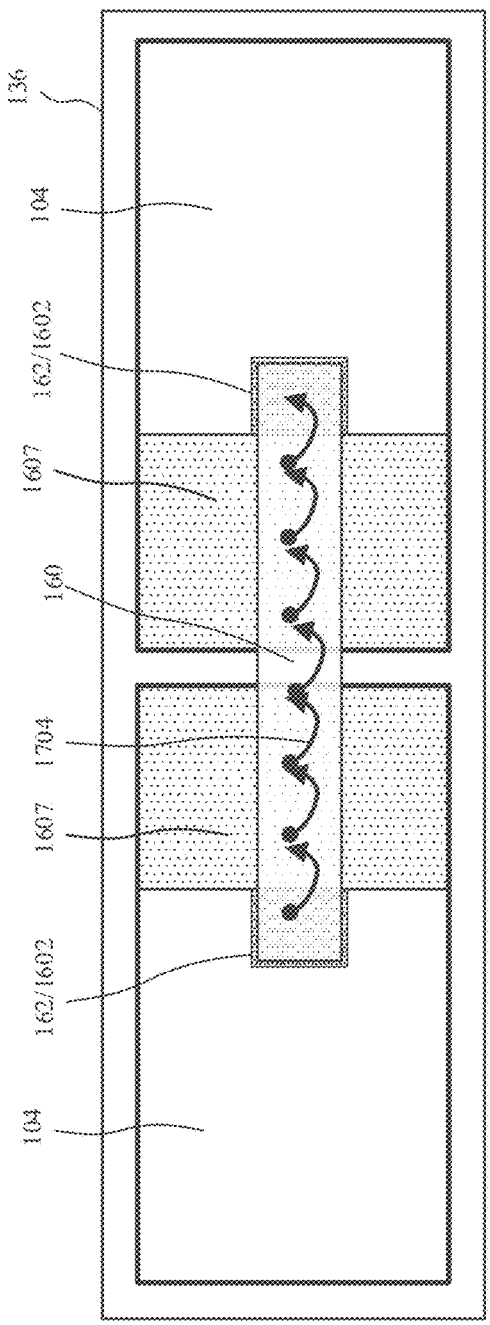
FIG. 16
FIG. 17

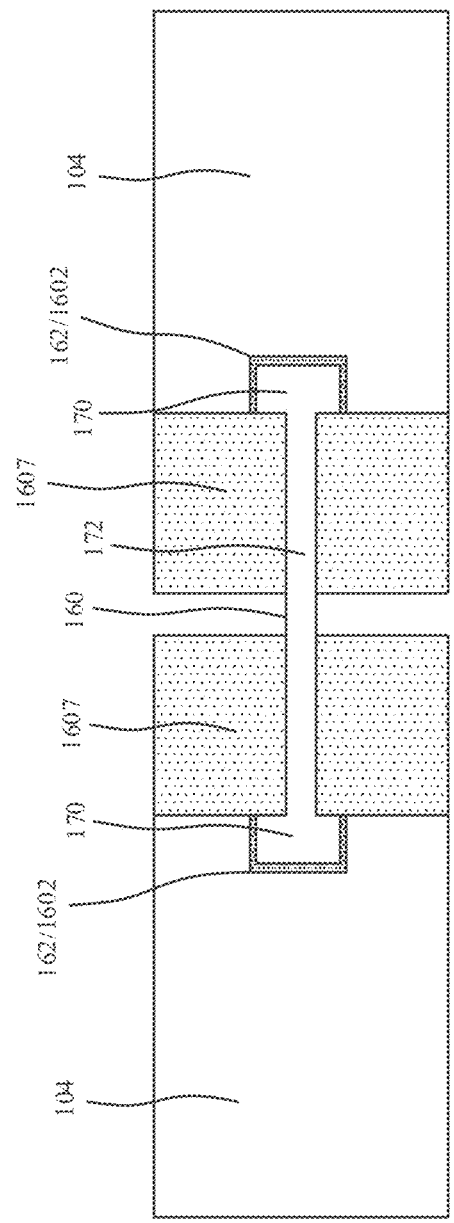
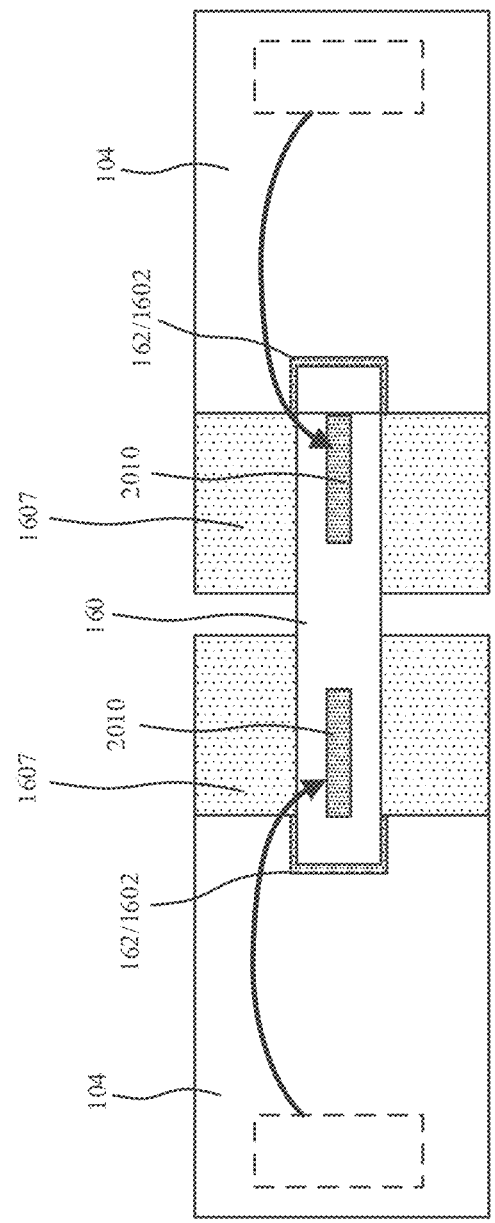

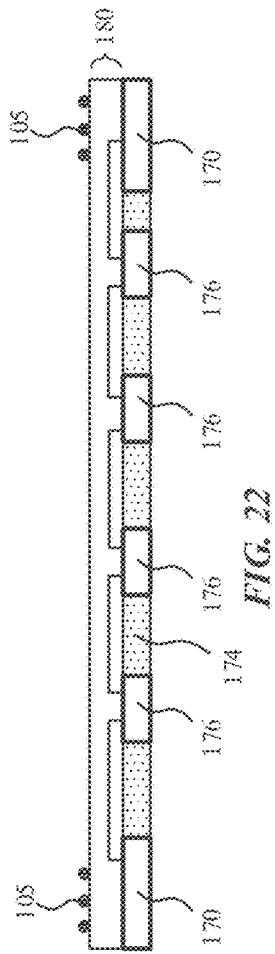
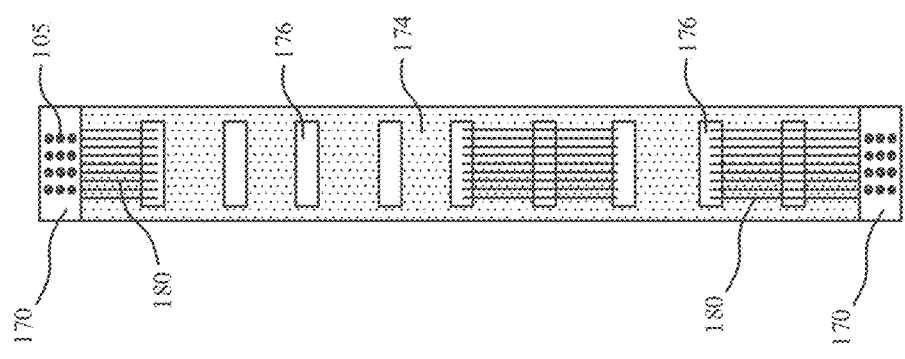
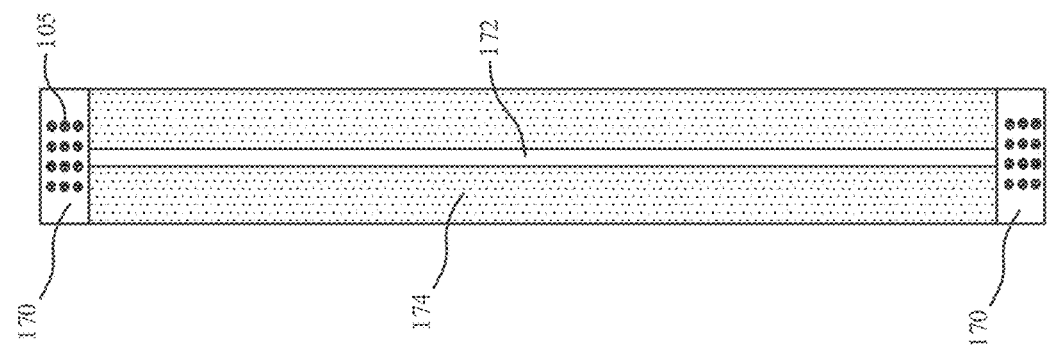

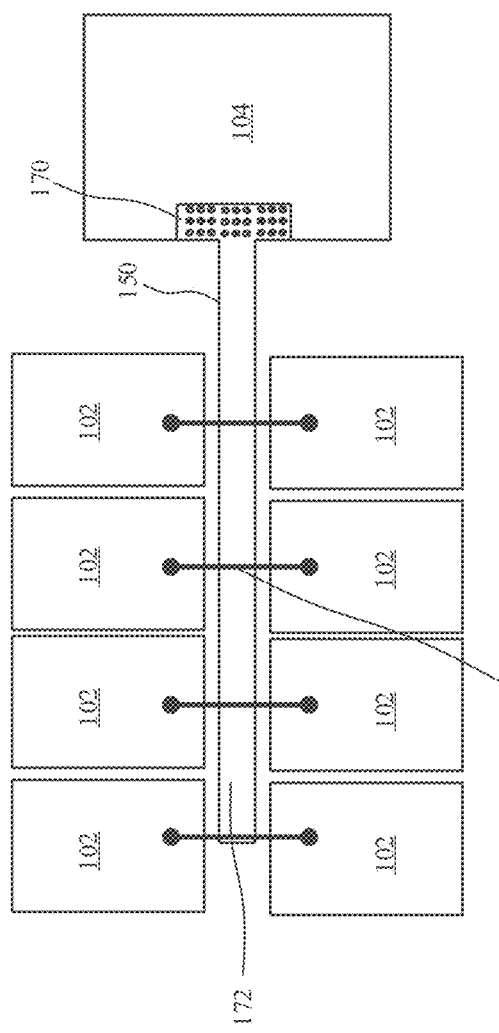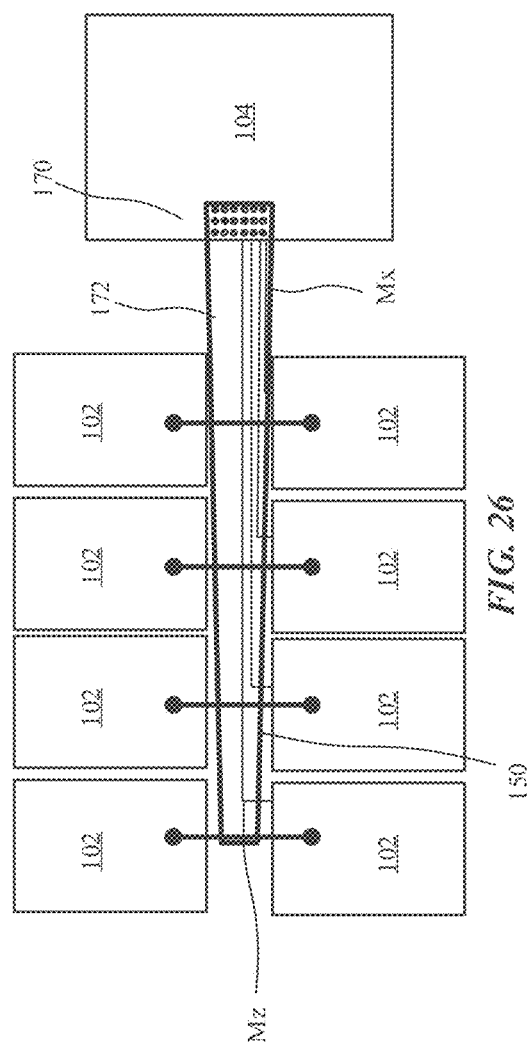

SYSTEMS AND METHODS FOR IMPLEMENTING A SCALABLE SYSTEM

RELATED APPLICATIONS

This application claims the benefit of priority of U.S. Provisional Application No. 62/656,584 filed Apr. 12, 2018, which is incorporated herein by reference.

BACKGROUND

Field

Embodiments described herein relate to scalable systems, and more particularly to scalable logic and modular memory.

Background Information

Scalable systems require both logic and memory that can be increased in a practical and cost effective method. Further, they should reasonably allow logic and memory scaling independently, to allow for compute, memory bandwidth, and memory capacity tuning as per system requirement. Dynamic random access memory (DRAM) has long been a commodity product for the computer and electronics industries. With a host of end market applications ranging from desktop computers, mobile electronics devices, data centers and networking platforms there has been a rapid development of competing memory platforms depending upon specific requirements, such as bandwidth, capacity, power, latency, and footprint. However, increasing one parameter is often met with tradeoffs of other parameters. For example, increasing DRAM bandwidth often comes with a penalty in other parameters.

Low power double data rate (LPDDR) standards have long been adopted across a variety of markets, including mobile electronics, to meet the performance and capacity requirements. LPDDR platforms and next generations (LPDDR-x) commonly include an arrangement of memory chips or packages around a system on chip (SOC) which may include a central processing unit (CPU) and/or graphics processing unit (GPU). In order to meet demands for increased bandwidth, various 3D solutions have been proposed that include stacked DRAM dies, such as high bandwidth memory (HBM) and hybrid memory cube (HMC).

BRIEF DESCRIPTION OF THE DRAWINGS

FIG. 3 includes schematic top and side view illustrations of a multi-chip system with scaled logic in accordance with an embodiment.

FIG. 6 is a schematic top view illustration of a scaled logic with 2.5D chip-to-chip routing and bridge in accordance with an embodiment.

FIG. 7 is a schematic top view illustration of a scaled logic with hybrid of on-chip die-to-die routing and 2.5D chip-to-chip routing in accordance with an embodiment.

FIG. 16 is a schematic top view illustration of a scaled system with die-to-die routing in accordance with an embodiment.

FIG. 17 is a schematic top view illustration of an interfacing bar routing in accordance with an embodiment.

FIG. 19 is a schematic top view illustration of an interfacing bar with hammer head shape in accordance with an embodiment.

FIG. 20 is a schematic top view illustration of an interfacing bar including relocated die logic in accordance with an embodiment.

FIG. 21 is a schematic top view illustration of an interfacing bar active area in accordance with an embodiment.

FIG. 22 is a schematic top view and cross-sectional side view illustration of an interfacing bar with multiple discrete active components in accordance with an embodiment.

FIGS. 25-26 are schematic top view illustrations of interfacing bars with different form factors in accordance with embodiments.

DETAILED DESCRIPTION

Figure 1:
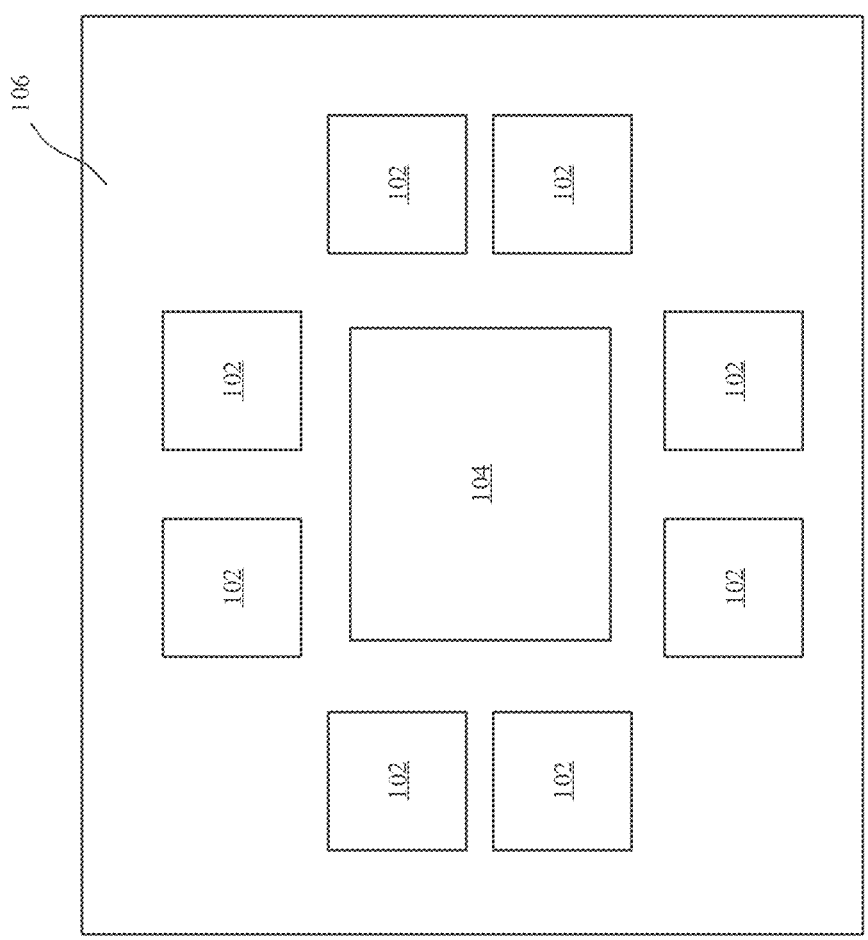
FIG. 1 is a schematic top view illustration of a plurality of memory chips arranged around a system-on-chip.

Embodiments describe multi-chip systems and structures for modular scaling. In some embodiments an interfacing bar is utilized to couple adjacent chips. In one aspect, the interfacing bars may increase the available periphery for chip-to-chip connection, and overall capacity. In another aspect, the interfacing bars can be utilized for increased bandwidth of chip-to-chip communication, with mitigated latency.

In one implementation, an interfacing bar may be utilized as a communication bar between logic chips. In such an implementation, the interfacing bar may be oriented toward communications, meeting bandwidth, power, latency and cost goals. The logic chips, such as system on chip (SOC), may include central processing units (CPU) or graphics processing units (GPU). In addition, the logic chip periphery may be formatted to enable memory integration and other in/out (I/O) to other devices. The interfacing bars may support metal stacks, and logic (e.g. transistor types) compatible with communication function. The interfacing bars may be packaged in a variety of configurations, including chip on wafer (CoW) and 2.5D packaging techniques. CoW may also be a 2.5D or 3D arrangement, for example. Here the individual chips are bonded together (chip-to-chip), or to an interposer (chip-interposer-chip). The joining technologies may be micro-bumps (dense I/O), or ACF, or hybrid bonding (metal-metal) supporting very dense IO, or even optical. Instead of individual chips, wafer to wafer (W2W) bonding is also possible, and can be used as per application. For example, CoW may involve the singulated area of the support wafer, or panel, being bigger than the chip mounted on the support wafer, while W2W may involve equal areas of the singulated wafers, or panels. 2.5D packaging may use a smaller dense interconnect connection between two chips. The chiplets used for 2.5D packaging may be a smaller length passive bridge, or longer length, arranged as interfacing bars. These interfacing bars provide options to balance bandwidth, power, complexity, thermal and power delivery and other architectural requirements. Further the interfacing bars can be active silicon (or other device technology like GaAs). The interfacing bars may also be encapsulated in a molding compound, and optionally include multiple components connects by bridges. Thus, an interfacing bar utilized for 2.5D packaging can also be individually formed and packaged using 2.5D packaging. Larger interfacing bars may also place special requirements in assembly to substrates, to manage the mechanical stress, and other assembly issues. The connection between the chip and interfacing bar may be using solder (micro-bumps), or ACF, and hybrid bonds (metal-metal). In some exemplary implementations, CoW integration may be utilized for performance logic with dense I/O using micro-bumps or even denser hybrid bonding. In some implementations CoW integration may include hybrid bonding of silicon chiplets with interposer. In some embodiments CoW integration may include silicon chiplets connected with back-end-of-the-line (BEOL) interconnections, in chip-like fashion. For example, the silicon chiplets may have partial BEOL build-up structure and interconnections, with subsequent second level BEOL build-up structure that connects the silicon chiplets, with a chip-like fashion. The silicon chiplets may be embedded in an inorganic gap fill (e.g. oxide) material upon which the second level BEOL build-up structure is formed. 2.5D packaging in some embodiments may be utilized for chip set light functions with moderate bandwidth and latency requirements.

In one implementation, an interfacing bar may be utilized as a memory bar to couple a group of memory chips to a logic chip. The group of memory chips may be laterally separate. Additionally, the laterally separate memory chips may each be packaged, or part of a die stack with multiple dies, or module. Thus, laterally separate chips in accordance with embodiments may be a part of laterally separate packages, die stacks, or modules. In one aspect, the interfacing bars may enable logic chips to communicate with DRAM chips of various types, including LPDDR-x, DDR, HMB, etc. In accordance with embodiments, memory chips are not limited to DRAM, or variations of LPDDR-x, DDR, HBM, etc. Likewise, logic chips may include a variety of functions such as, but not limited to, SOC, CPU, GPU, caches, signal processors, glue logic, etc. and may be based on silicon, or other technology (e.g. GaAs). The interfacing bars may include local controllers compatible to memory type, as well as a physical interface (PHY) (e.g. PHY analog and PHY digital controller) compatible with the memory. In some implementations, the memory bars are packaged in configurations such as 2.5D packages, multi-chip modules (MCM), and MCM plus bridge. Additionally, the memory bars may be packaged in a variety of shapes for routing, such as L-shaped.

In accordance with embodiments, configurations are illustrated for modular scaling of logic and/or memory. In one aspect, on-chip resources may be utilized for logic scaling. For example, on-chip routing may be utilized for connection of multiple dies on the same silicon layer. Such available on-chip resources may facilitate high density, low power scaling, and may additionally leverage CoW techniques.

In another aspect, interfacing bars may be utilized for logic-logic die scaling. Such interfacing bars, or communication bars, may include active silicon, increase the area for logic connections, and provide flexibility in scaling (e.g. SOC+CPU+GPU+others). Various cost control implementations may be included. For example, logic can be moved from a logic chip to the communication bar to reduce cost of the logic chips. The communication bars can also provide voltage shifting capability. Additionally, the communication bar can include discrete extension section areas, tapered structure, or hammerhead structure to reduce silicon cost, as more die per wafer are realized.

In another aspect, interfacing bars may be utilized to increase logic chip periphery for memory scaling. Such interfacing bars, or memory bars, may facilitate scaling to large memory capacity. Additionally, chains of memory bars may be used to further increase capacity. In accordance with embodiments, metal layer prioritization and binning may be utilized for latency management, particularly for memory chips located further away from the logic chip. Similar to communication bars, various cost control measures may be included. Significantly, memory bars may be compatible with a variety of memory types including LPDDR-x, DDR, HBM, etc. In some embodiments, the memory bar may incorporate a physical interface (PHY) and memory (e.g. DRAM) controller. The memory bars can also provide voltage shifting capability.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known components, semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", and "on" as used herein may refer to a relative position of one layer with respect to other layers. One layer "above", "over" or "on" another layer or bonded "to" or in "contact" with another layer may be directly in contact with the other layer or may have one or more intervening layers. One layer "between" layers may be directly in contact with the layers or may have one or more intervening layers.

FIG. 1 is a schematic top view illustration of a plurality of memory chips 102 (e.g. DRAM) arranged around a logic chip 104 (e.g. SOC) on a board 106 (e.g. printed circuit board (PCB) or multi-chip-module (MCM)) in a conventional memory system. It has been observed that such a system may suffer from a limited logic chip 104 interface area (e.g. periphery length of the SOC) with memory chips 102. This limited area/perimeter may constrain the ability to expand memory capacity of the system. It has additionally been observed that direct chip attach of logic chip 104 and/or memory chips 102 to board 106 can be problematic due to coefficient of thermal expansion (CTE) mismatch, which may result in coarser pitch I/O, and lower pin count.

Figure 2:
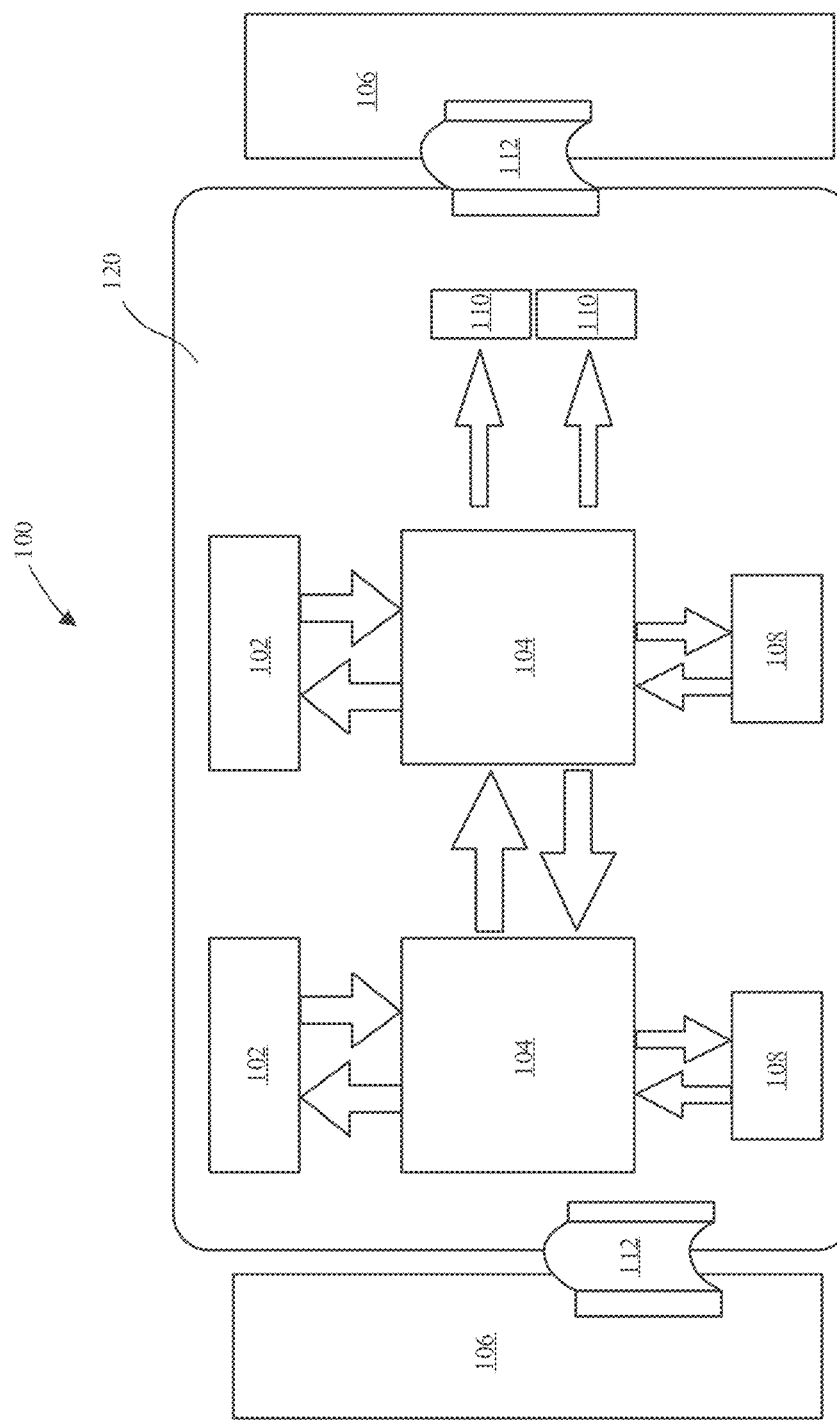
FIG. 2 is a schematic top view illustration of a multi-chip system with scaled logic in accordance with an embodiment.

FIG. 2 is a schematic top view illustration of a multi-chip system 100 with scaled logic in accordance with an embodiment. Such a configuration may simplify the interconnect hierarchy of more conventional memory systems, with CTE matching, and no mechanical pinning of large silicon (or interposer) to a highly mismatched substrate (e.g. board 106). Furthermore, the system may increase logic chip periphery, and memory chip interface with the SOC. In the embodiment illustrated, one or more logic chips 104 (e.g. SOC) and memory chips 102 may be mounted on a CTE matched substrate 120, such as glass, silicon, interposer, matched metal stabilized substrate, MCM substrate, etc. This CTE matching may allow for finer pitch bumping, or anisotropic conductive film (ACF) attach, of the memory chips 102 and/or logic chips 104 as well as for larger silicon chip integration. Close CTE match with silicon may be obtained with glass, silicon, or organics with large inorganic (e.g. glass) content, for example. As used herein the term "CTE match" means that the "effective CTE" of a "composite material" or "composite topology" with different constituents matches the CTE of another monolithic material or the effective CTE of another composite material. Inside a composite material, each of its constituents has its own CTE and elastic modulus. One non-limiting example of the so-called "composite material" could be an MCM substrate which has multiple layers of materials. Another example of the "composite material" could be a memory (e.g. DRAM) chip or package which as silicon, molding compound, and a memory package substrate. In such an example, the "effective CTE" of the MCM substrate may be designed to match the effective CTE of the memory chip or package to minimize the overall MCM warpage. The memory chip or package may also be considered a "composite topology" on the substrate. In a larger system example, all components on top of the (e.g. MCM) substrate may be treated as one "composite topology." The effective CTE of this composite topology may be calculated, and the MCM substrate designed to possess an effective CTE that matches the effective CTE of the composite topology.

In accordance with embodiments, the substrate may be characterized by a composite coefficient of thermal expansion (CTE) that is matched within +/−4 ppm/C of an effective CTE of a composite topology on the substrate, or even more specifically +/−2 ppm/C. Effective CTE and CTE matching is dependent upon temperature. For example, silicon has a CTE of approximately 2.6 ppm/C at 20 degrees C., and a CTE of approximately 3.6 ppm/C at 250 degrees C.

An example of CTE matching is to make the effective CTE of a package substrate (e.g. MCM substrate) close to 3 ppm/C for a silicon dominant composite topology. In this case a glass core, and other high modulus and low CTE cores are suitable options for the MCM or package substrate. For a MCM composite topology with both silicon SOC and multiple memory (e.g. DRAM) packages, the overall effective CTE of the composite topology on top of the MCM substrate can be calculated using finite element method (FEM) simulation. Typical values for the effective CTE of the composite topology may range from 3 ppm/C to 10 ppm/C in the temperature range from 20 degrees C. to 150 degrees C. At higher temperatures, such as near a solder reflow temperature of 250 degrees C., the effective CTE of the composite topology including molding compound may have an even higher effective CTE due to molding compound's increase of CTE beyond its glass transition temperature (Tg), which may often be around 125 degrees C. For example, the effective CTE of a DRAM package can range from 8 ppm/C to 18 ppm/C at temperatures beyond the molding compound Tg (e.g. 150 C to 250 C) depending upon the molding compound material properties and its relative volume to the DRAM dies. By properly picking material properties of the MCM substrate and also proper material properties of the DRAM packages and the geometric parameters, such as the DRAM die thickness, the effective CTE of the MCM substrate can be made to match the DRAM packages.

Additional components 108 such as disk, and components 110 such as local area network (LAN), wireless, optics, etc.

connections may also be mounted on the substrate 120. In an embodiment, the substrate 120 is flexibly connected with the board 106 using a flex circuit 112, as opposed to rigid connection. The system 100 of FIG. 2 may additionally provide for high bandwidth and cost-effective memory expansion. For example, a long periphery SOC can be obtained by connecting smaller logic chips 104 (e.g. SOCs) using on-chip resources, CoW techniques, or communication bars. Additionally, memory bars may be used expand memory chip 102 to logic chip 104 connections, with high bandwidth, and mitigated latency and power penalties.

In another embodiment, a multi-chip system 100 includes routing through the MCM (including substrate 120 and silicon chip mounted thereon) to the board 106 (e.g. PCB, other MCM, modules etc.), and attaching. The attach may be a suitable structure that allows assembly, and while not stressing the silicon chips on top. Such systems that may allow substrate 120 to be mounted on a PCB, may employ sockets with pins, soft solders etc. to manage the mechanical stress.

FIG. 3 includes schematic top and side view illustrations of a multi-chip system with scaled logic in accordance with an embodiment. Similar to the embodiment illustrated in FIG. 2, the system 100 may include a single large logic chip 104, or multiple logic chips 104. The increased perimeter may facilitate the location of a larger number of memory chips 102. Additionally, routing length to each memory chip 102 can be decreased due to the increased perimeter, which may further enhance I/O speed. For added strength, and to control any CTE mismatch, a stiffener 122 (e.g. ring) may be placed on or in the substrate 120. As shown in the cross-sectional side view illustration, the substrate 120 may include a plurality of through vias 124 (or interconnects) to the back side. The memory chips 102 (or packages, or die stacks), and logic chip 104 may be mounted with solder bumps 105 (including micro bumps), allowing for very large scale integration (VLSI) and fine pitch I/O due to CTE matching. As shown, attachment to the board 106 with a flex circuit 112 allows the substrate 120 to be secured to the board 106 using a suitable loose mechanical coupling 113 such as an adhesive film (or pressure sensitive adhesive).

Figure 4:
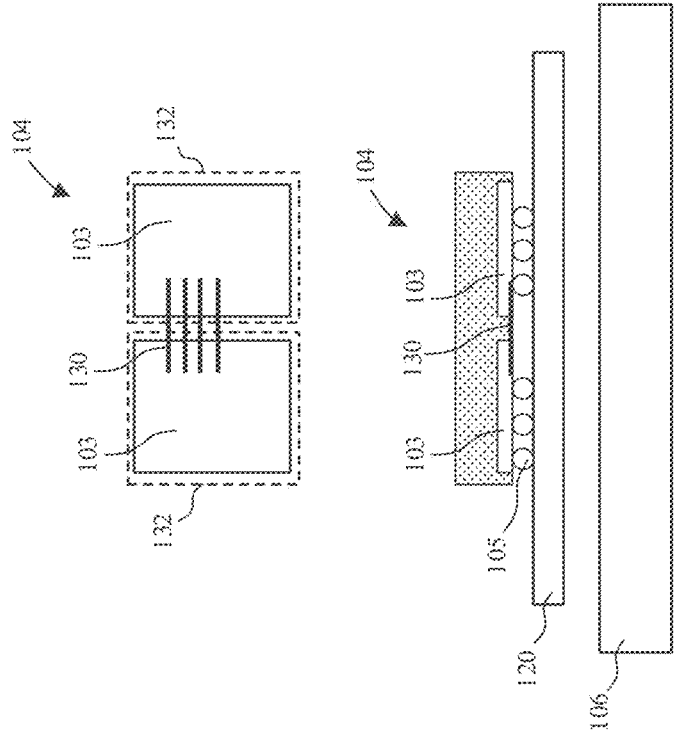
FIG. 4 is a schematic top view illustration of a scaled logic die with on-chip die-to-die routing in accordance with an embodiment.

Referring now to FIGS. 4-7 schematic top view and corresponding cross-sectional side view illustrations are provided for various scaled logic in accordance with embodiments. FIG. 4 is a schematic top view illustration of a scaled logic die with on-chip die-to-die routing in accordance with an embodiment. As shown logic chip 104 includes two dies 103 that can be routed together using on-chip routing 130, such as with common back-end-of-the-line (BEOL) processing to form a build-up structure with M0-Mn metal layers. In an embodiment, each die 103 may have its own metallic seal ring 132, with the on-chip routing 130 extending through the seal rings 132. In the embodiment illustrated in FIG. 4, the two dies 103 share a same silicon layer, and are interconnected with an on-chip build-up structure (on-chip routing 130). In addition there may be provision to dice the two dies 103 separately, or leave together.

Figure 5:
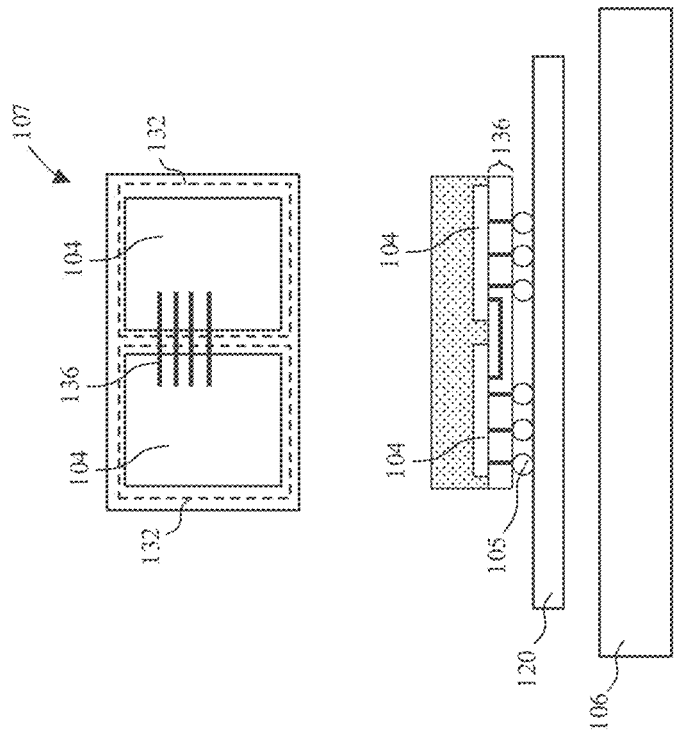
FIG. 5 is a schematic top view illustration of a scaled logic with 2.5D chip-to-chip routing in accordance with an embodiment.

FIG. 5 is a schematic top view and corresponding cross-sectional side view illustration of a scaled logic with 2.5D chip-to-chip routing in accordance with an embodiment. As shown, the logic chips 104 are connected together in a chip on wafer (CoW) package 107. The logic chips may be embedded in a molding compound (illustrated as the shaded material) in some embodiments. In other embodiments, the logic chips 104 are embedded in an inorganic gap fill material (e.g. oxide, illustrated as the shaded material). The logic chips 104 may be bonded to the wiring layer 136 with micro bumps, hybrid bonds, or wiring layer 136 may be a second level BEOL build-up structure formed on the logic chips 104 (e.g. chiplets). The logic chips 104 may be from different wafers (same or different technologies). In such a configuration, a wiring layer 136 may be used to connect the two discrete logic chips 104. In an embodiment, the wiring layer 136 is an interposer layer, or second level BEOL build-up structure. In such an embodiment, the two discrete logic chips 104 may be mounted on the wiring layer 136 (interposer) with a plurality of micro bumps or hybrid bonding. For example, the wiring layer 136 may be a silicon substrate interposer (with through vias for back side connection) for connecting with the logic chips 104.

FIG. 6 is a schematic top view and corresponding cross-sectional side view illustration of a scaled logic with 2.5D chip-to-chip routing and bridge in accordance with an embodiment. FIG. 6 is substantially similar to that illustrated in FIG. 5, with the addition of a bridge 140 within the wiring layer 136 (interposer). For example, bridge 140 may be a silicon bar with routing layers. In one embodiment, rather than forming wiring layer 136 from a silicon interposer, wiring layer may include a dielectric material, with through dielectric vias, and the embedded bridge 140. In an embodiment, the bridge 140 may include active silicon, similar to a communication bar. In an embodiment, the bridge 140 is passive.

FIG. 7 is a schematic top view and corresponding cross-sectional side view illustration of a scaled logic with hybrid of on-chip die-to-die routing and 2.5D chip-to-chip routing in accordance with an embodiment. FIG. 7 is substantially similar to that illustrated in FIG. 5, with the addition of some on-chip routing 130 in combination with wiring layer 136.

Figure 8:
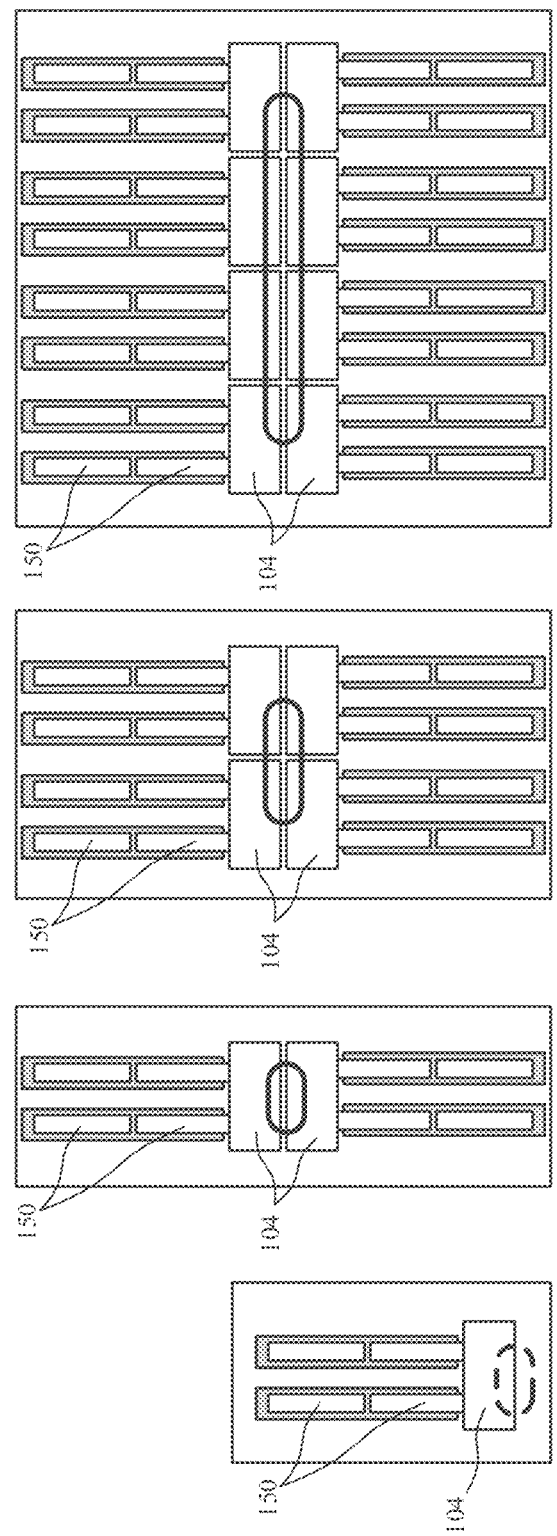
FIG. 8 is a schematic top view illustration of modular scaling of logic with increased periphery in accordance with an embodiment.

Referring now to FIG. 8, a schematic top view illustration is provided of various configurations for modular scaling of logic with increased periphery in accordance with an embodiment. As shown, various logic chips 104 (or dies 103) can be scaled to have die-to-die or chip-to-chip interconnections (generally illustrated in bold elliptical lines) using any of, but not limited to, the exemplary configurations illustrated and described with regard to FIGS. 4-7, including passive and active communication bar. Also other network on chip (NOC) topologies may be used. As shown, as additional chips/dies are connected, the available periphery increases. In other embodiments, the logic chips 104 are connected with interfacing bars, or communication bars 160, as described in further detail herein. Also illustrated in FIG. 8 is the inclusion of additional interfacing bars, or memory bars 150, that can extend from the logic chips 104. As described in further detail herein, the memory bars 150 may be used to couple the logic chips to additional memory chips 102, further increasing the connection density to the periphery of the logic chips 104.

Figure 9:
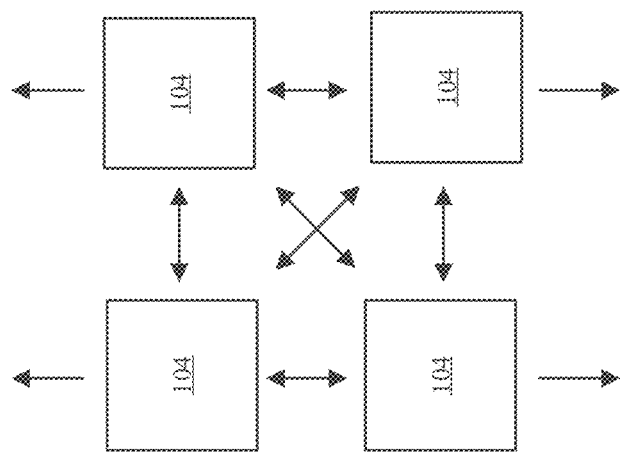
FIG. 9 is a schematic top view illustration of scaled logic connectivity in accordance with an embodiment.

FIG. 9 is a schematic top view illustration scaled logic connectivity in accordance with an embodiment. The exemplary illustration provided is with four logic chips 104, though this is intended as exemplary, and embodiments are not so limited. As shown, each logic chip 104 may be connected. Additionally, the logic chips may have connections to exterior components.

Figure 10A:
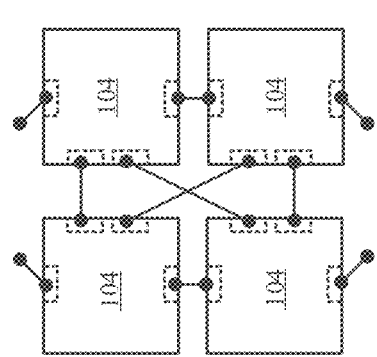
FIG. 10A is a schematic top view illustration of logic connectivity overhead in accordance with an embodiment.
Figure 11A:
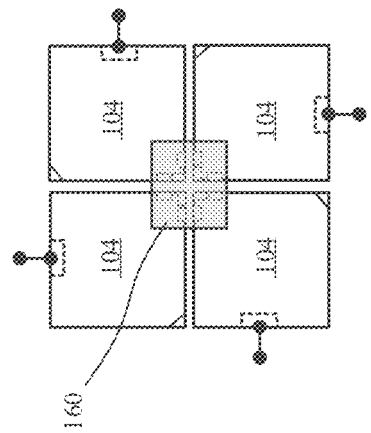
FIG. 11A is a schematic top view illustration logic connectivity overhead in accordance with an embodiment.
Figure 10B:
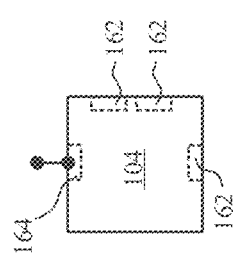
FIG. 10B is a schematic top view illustration of scaled logic connectivity overhead in accordance with an embodiment.
Figure 11B:
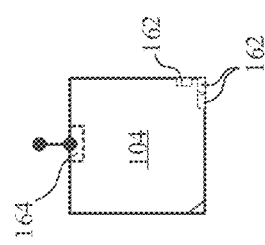
FIG. 11B is a schematic top view illustration scaled logic connectivity overhead with communication bar in accordance with an embodiment.

FIG. 10A is a schematic top view illustration logic connectivity overhead in accordance with an embodiment. FIG. 10B is a schematic top view illustration of scaled logic connectivity overhead in accordance with an embodiment. As shown, each logic chip 104 may include area reserved for logic chip-to-chip connections 162, as well as for external I/O connections 164. Alternatively, connections 162 and 164 may be a universal port. In general for high performance, high bandwidth interconnections may use serializer/deserializer (SerDes) technology, and the area and power penalty for these ports may be significant. Where wiring is included in a multi-chip-module (MCM) or PCB, the committed on-chip area may be larger than what is actively used on the logic chip 104. FIGS. 11A-11B illustrate an alternative logic connectivity overhead, with scaled logic connectivity overhead with one or more communication bars 160 in accordance with an embodiment. As shown, each of the logic chips 104 can be manufactured with similar built-in connections 162, 164. In the illustrated embodiment, the total area reserved for the connections 162, 164 can be significantly reduced, thus requiring less overhead in the logic chips 104. Also bandwidth and power is more scalable. One or more communication bars 160 may be used to connect the plurality of logic chips.

Figure 12A:
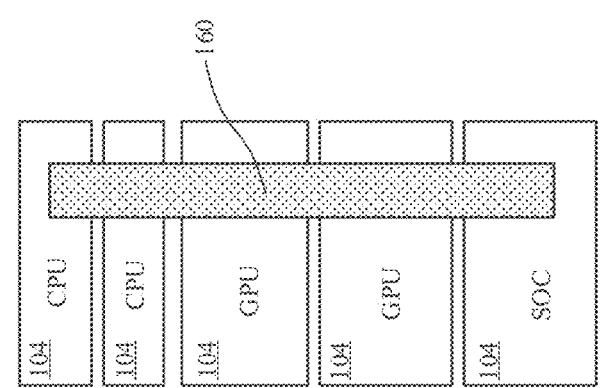
FIG. 12A is a schematic top view illustration of 3D scaling of logic chips with a communication bar in accordance with an embodiment.
Figure 12B:
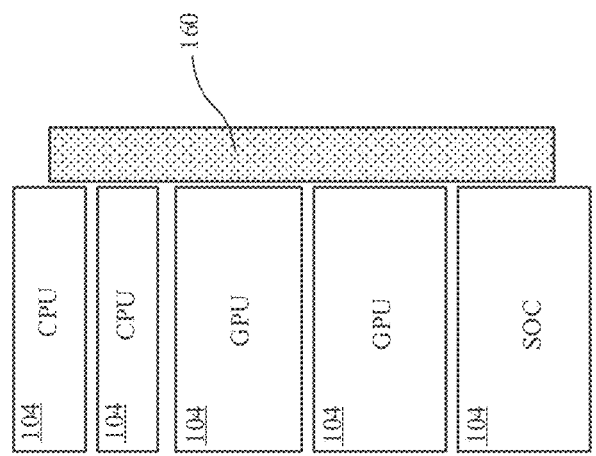
FIG. 12B is a schematic top view illustration of planar scaling of logic chips with a communication bar in accordance with an embodiment.

Referring now to FIGS. 12A-12B, FIG. 12A is a schematic top view illustration of 3D scaling of logic chips with a communication bar 160 in accordance with an embodiment, and FIG. 12B is a schematic top view illustration of planar scaling of logic chips with a communication bar 160 in accordance with an embodiment. As shown, the communication bar 160 may be used to provide modularity to a variety of combinations of logic chips 104 including CPU, GPU, caches, signal processors, glue logic, etc. and SOC. In the embodiment illustrated in FIG. 12A, the communication bar 160 may be placed over/under the logic chips 104. In the embodiment illustrated in FIG. 12B, the communication bar 160 may be placed laterally adjacent the logic chips 104.

The communication bars 160 in accordance with embodiments can be used to provide high bandwidth, low power, scalable connectivity between two or more chips. Use of communication bars allows flexibility for location of I/O terminals on the logic die, which do not have to be at the die/chip edges. Furthermore, there is flexibility of start and endpoint location. In some embodiments, the communication bars 160 may include an active piece of silicon, and can provide flexibility and ease of design to the logic chips 104.

Figure 14:
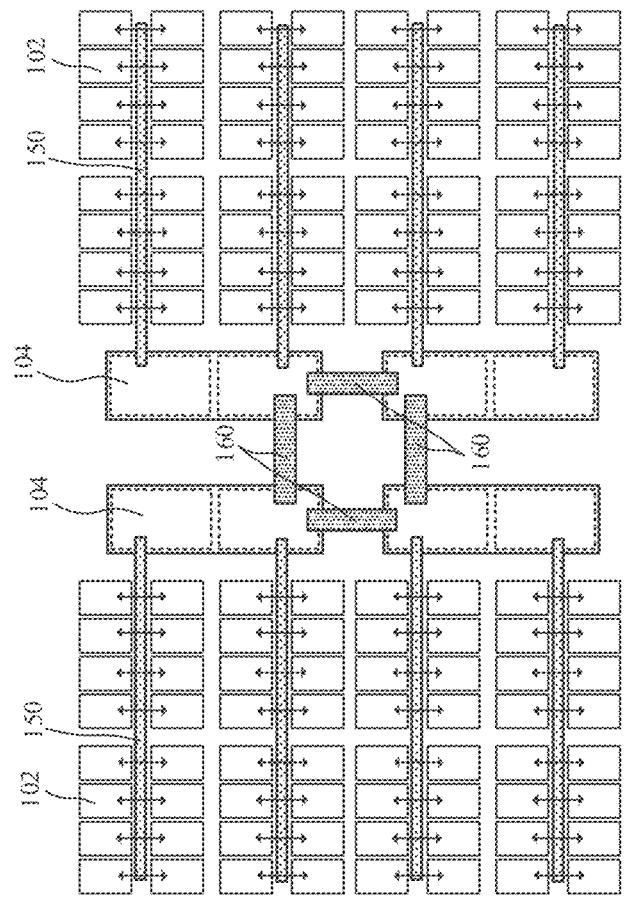
FIG. 14 is a schematic top view illustration of a multi-chip system with scaled logic and memory, and short logic connectivity in accordance with an embodiment.
Figure 13:
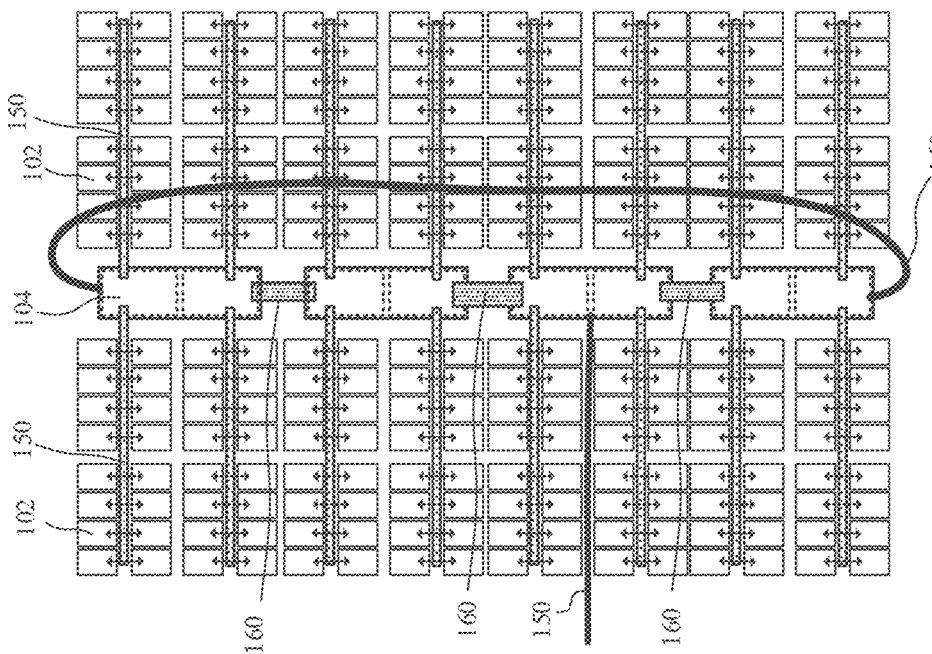
FIG. 13 is a schematic top view illustration of a multi-chip system with scaled logic and memory, and high capacity in accordance with an embodiment.

Referring now to FIG. 13-14, schematic top view illustration are provided for multi-chip systems with scaled logic and memory in accordance with embodiments. As shown in each figure, logic chips 104 are optionally electrically connected, for example using any of the arrangements of FIGS. 4-7. Additionally, logic chips 104 may be electrically connected with communication bars 160. Logic chips/dies may also be connected using combinations of FIGS. 4-7 in combination with communication bars 160. Further communication bars completing an "X" connection may be implemented, with a cross-bar or jumper in between. Groups of memory chips 102 are additionally coupled with the logic chips 104 with memory bar 150, which may optionally be placed in series to increase memory density. Thus, in accordance with embodiments, the connectivity organization, and even bandwidth and latency, can be tailored. Furthermore, the logic chips 104 do not need to be pre-committed to providing maximum bandwidth and routing resources. The arrangement in FIG. 13 in particular may be high memory capacity with a drawback of comparatively more latency between logic chips 104, while the arrangement in FIG. 14 in particular may be for short logic connectivity, less latency with comparatively less memory capacity. Referring again to FIG. 13, also illustrated are long interfacing bars, which may be flexible. For example, such long interfacing bars may be communication bars 160 for logic-to-logic connection, or memory bars 150 for memory connection. As described in further detail with regard to FIG. 18C, such long interfacing bars may be optical interconnects.

Figure 15:
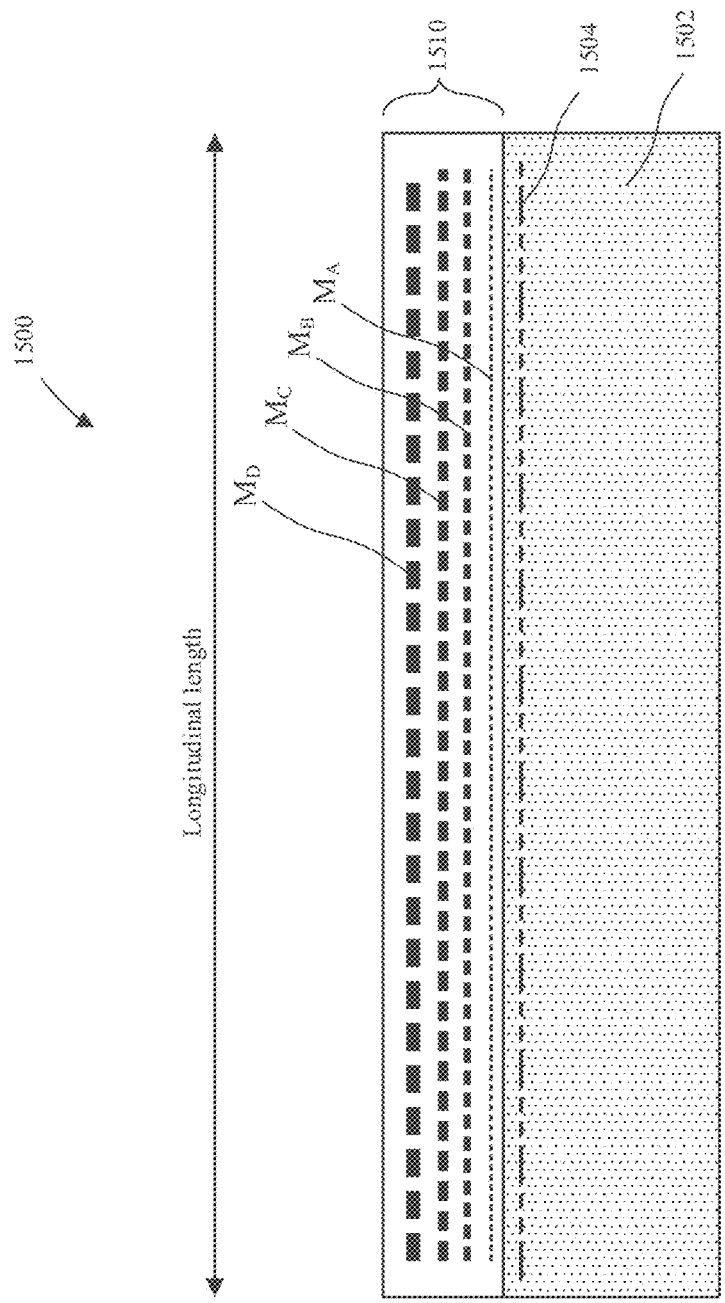
FIG. 15 is a schematic cross-sectional side view illustration of an interfacing bar metal wiring layers in accordance with an embodiment.

FIG. 15 is a schematic cross-sectional side view illustration of an interfacing bar metal wiring layers in accordance with an embodiment. As described above, both the communication bar 160 and memory bar 150 may be more generically characterized as an interfacing bar 1500. In the embodiment illustrated, the interfacing bar 1500 includes a substrate 1502, and routing layer 1510. The substrate 1502 may be formed of a semiconductor material such as silicon to support front-end semiconductor fabrication of devices. Thus, the silicon substrate 1502 may include active silicon 1504 (or other material) to include features such as logic, repeaters, flops, cache, memory compressors and decompressors, controllers, local processing elements, etc. Other non-silicon technologies such as, but not limited to, GaAs may also be used for substrate 1502 if appropriate, or even optical interconnect technologies, many of which are supported by silicon. The routing layer 1510 may include one or more metal and dielectric layers. Routing layer 1510 may be formed using thin film technology, or traditional BEOL processing techniques, such as damascene, etc. Routing layer 1510 may include wiring layers such as lower wiring layer $M_A$, middle wiring layers MB, Mc, and upper wiring layers $M_D$. As illustrated, the wiring layers may optionally have different thicknesses, with $M_D$ being the thickest, and $M_A$ being the thinnest. In some embodiments, the quality of service can be used to organize metal usage based on requirements such as latency, power, etc. In an embodiment, high priority traffic with low latency requirements can be on the higher (thicker) layers, while bulk traffic more latency latitude, may be in the lower (thinner) layers. In an embodiment, longer connections to chips located further away, or further down the longitudinal length of the interfacing bar 1500 may be made with the higher (thicker) layers, while shorter connections within the interfacing bar 1500 may be made with the lower layers. In some embodiments the interfacing bar 1500 (e.g. communication bar 160 or memory bar 150) includes through vias (e.g. through silicon vias) extending through the substrate 1502. For example, the through vias may be similar to those through vias 166 illustrated in FIG. 18A.

Referring again to FIGS. 13-14, in an embodiment a multi-chip system includes a first chip (e.g. logic chip 104), an interfacing bar 1500 (e.g. memory bar 150) coupled with the first chip, and a second chip (e.g. memory chip 102) coupled with the interfacing bar. The interfacing bar includes a routing layer 1510 that optionally extends a substantial portion of a longitudinal length of the interfacing bar 1500. Referring back to FIG. 11B in particular, in other embodiments, a routing layer 1510 may not necessarily extend a substantial portion of a longitudinal length of the interfacing bar 1500. Thus, such a configuration is dependent upon implementation. Still referring to FIGS. 13-15, the routing layer 1510 includes a plurality of metal layers including a lower wiring layer (e.g. $M_A$) and an upper wiring layer (e.g. $M_D$, or any wiring layer above $M_A$) that is characterized by a wider wiring than the lower wiring layer. In an embodiment, the second chip (e.g. memory chip 102) is electrically coupled with the first chip (e.g. the same memory chip 102) through a first wire running a substantial distance of the longitudinal length in upper wiring layer $M_D$. A third chip (e.g. another memory chip 102) may be electrically coupled with the first chip (104) through a second wire in the lower wiring layer $M_A$, where the first wire is wider than the second wire and the second chip (102) is located further away from the first chip (104) than the third chip (102 is. Thus, the second chip may be a second memory chip 102 located further away from the logic chip 104 than the first memory chip 102, with both being connected to the logic chip 104 by the same memory bar 150.

In accordance with embodiments, the interfacing bars 1500 are not only used for routing, but may also include active silicon. FIG. 16 is a schematic top view illustration of a scaled system with die-to-die routing in accordance with an embodiment. The particular embodiment illustrated is similar to that provided in FIG. 5 or FIG. 7, with a plurality of logic chips 104 connected together with a wiring layer 136 (or interposer). Each logic chip 104 may additionally include a die-to-die in/out (I/O) area 1602 and on-chip routing tunnels 1604. Actual die-to-die routing 1610 is located on the wiring layer 136 (interposer). Thus, each logic chip 104 includes a die area for on-chip routing tunnels 1604, which can include resources such as wires, repeaters, flops, etc. Each logic chip 104 (or die) may additionally include a high performance logic area 1607, which may be located near the adjacent logic chip 104. The high performance logic area 1607 may also be partitioned out as well.

FIG. 17 is a schematic top view illustration of an interfacing bar routing in accordance with an embodiment. As illustrated, the interfacing bar may be a communication bar 160 that couples a plurality of logic chips 104. The logic chips 104 are different from those illustrated in FIG. 16 in that the area previously reserved for on-chip routing tunnels 1604 can be relocated to the communication bar 160 as routing tunnels 1704. This provides more flexibility to design high performance logic areas 1607. Additionally, the die-to-die routing 1610 is moved to the communication bar 160. Thus, the wiring layer 136 (interposer) may optionally be omitted, or supplemented with communication bar 160. In an embodiment, the communication bar 160 is located in the wiring layer 136, similar to that illustrated in FIG. 6. Furthermore, location of the I/O areas 1602 is flexible, and it is not required for the I/O areas 1602 to be located at the die edges. The communication bar 160 may optionally include through vias (see FIG. 18A) for I/O and power/ground connectivity.

Figure 18A:
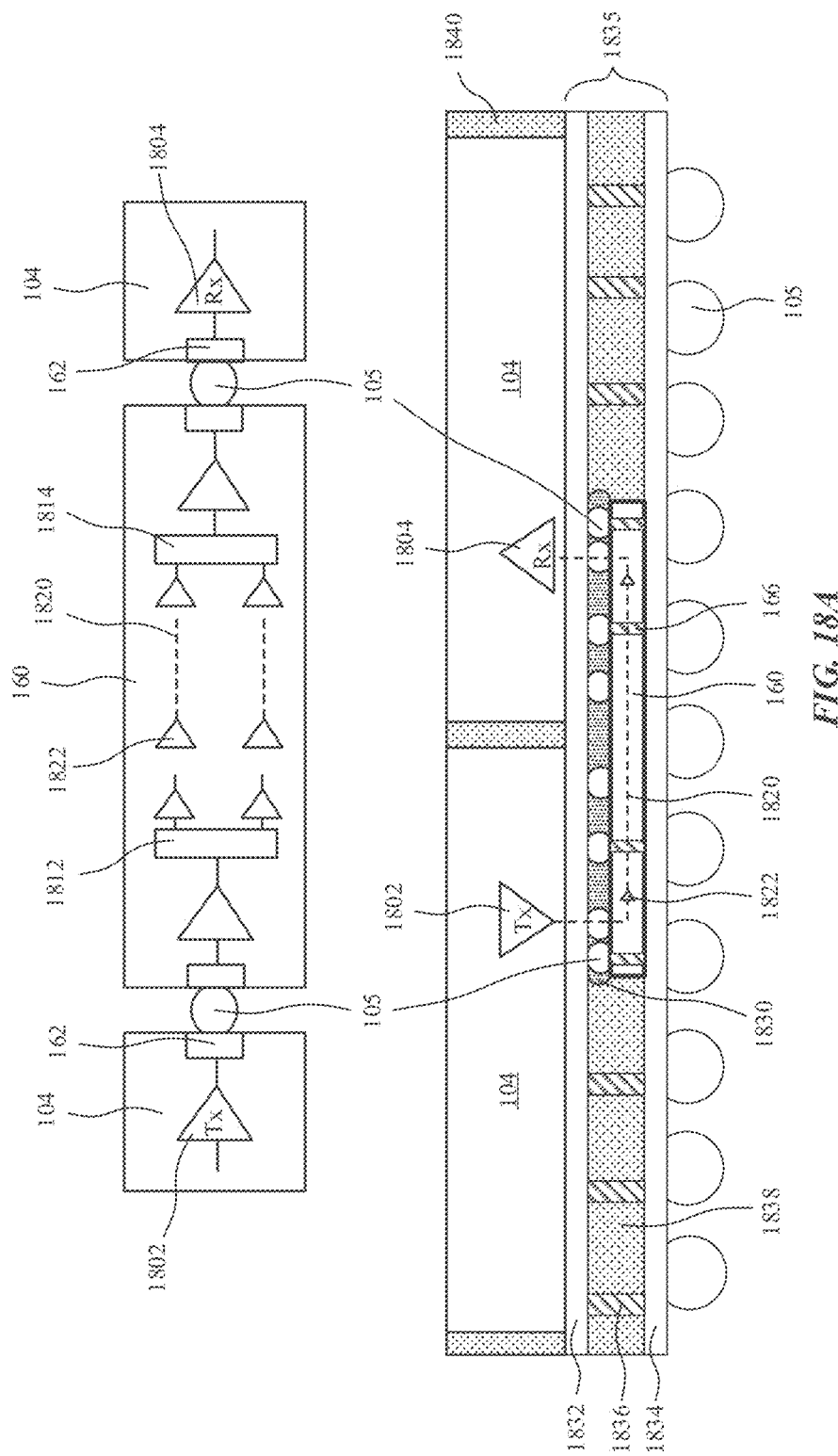
FIG. 18A is a schematic cross-sectional side and top view illustration of an interfacing bar and routing in accordance with an embodiment.
Figure 18B:
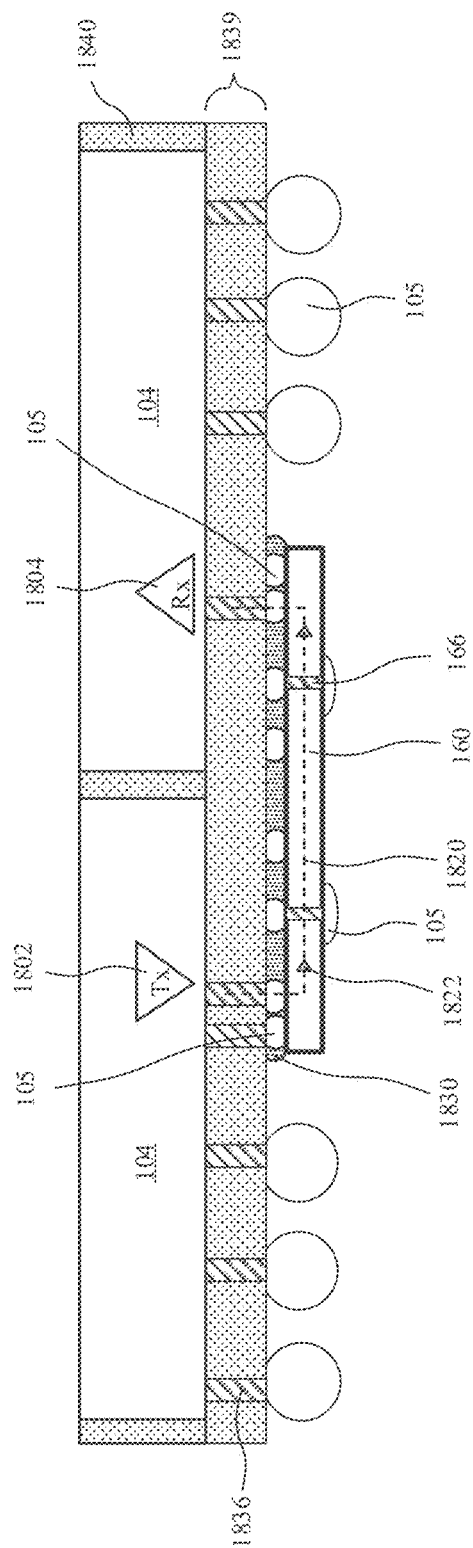
FIG. 18B is a schematic cross-sectional side view illustration of a BGA side mounted interfacing bar in accordance with an embodiment.
Figure 18C:
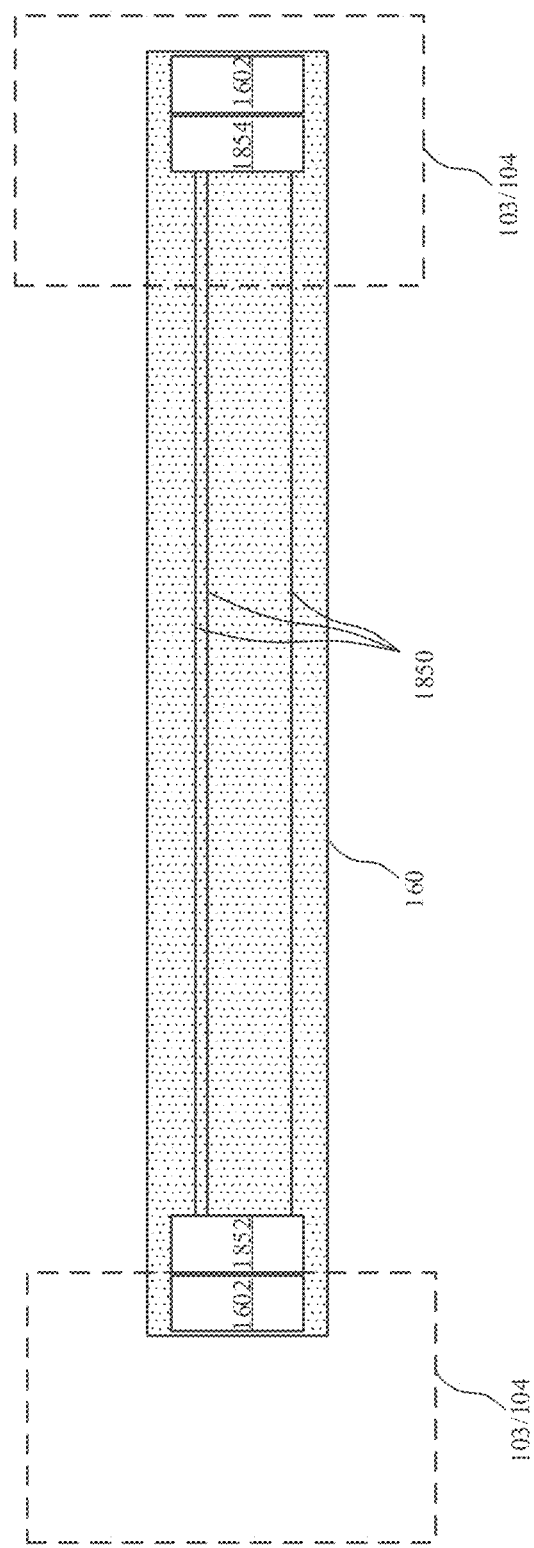
FIG. 18C is a schematic top view illustration of an optical communication bar in accordance with an embodiment.

FIG. 18A is a schematic cross-sectional side and top view illustration of an interfacing bar and routing in accordance with an embodiment. In the particular embodiment illustrated, the interfacing bar may be a communication bar 160 that couples a plurality of logic chips 104. As shown, the logic chips 104 and communication bar 160 may be connected by a plurality of solder bumps 105 (including micro bumps). The communication bar 160 may include active devices such as a deserializer 1812, serializer 1814, and a plurality of lanes 1820 extending between the deserializer 1812 and serializer 1814. The lanes 1820 may be coupled to active devices 1822, such as repeaters, flops, etc. The corresponding logic chips 104 may additionally contain transceivers 1802 and receivers 1804. In an embodiment, the interfacing bar or communication bar 160 includes a deserializer 1812, a serializer 1814, and a plurality of repeaters (e.g. active devices 1822) between the deserializer and the serializer. The communication bar 160 can also support other signaling schemes such as pulse amplitude modulation (PAM), simultaneous bi-directional (SBD), low swing differential etc. as suitable. Communication bar 160 may support other non-silicon technologies such as, but not limited to, GaAs if appropriate. In accordance with embodiments, a communication bar 160 may provide level shifting capabilities as required. Also, for still longer interconnect optical interconnects may be used as communication bar 160. FIG. 18C is a schematic top view illustration of an optical communication bar in accordance with an embodiment. For example, the communication bar 160 may be an optical interconnect including one or more waveguides 1850 that interfaces with a transmitter/receiver in a first logic chip/die 104/103 and transmitter/receiver in a second logic chip. The optical transmitter may be located in an electrical-to-optical converter component 1852. The optical transmitter may be a suitable type such as laser, light emitting diode, or other light source, modulator, etc. The optical receiver may be located in an optical-to-electrical converter component 1854. The optical receiver may be also selected based on optical link requirements from a variety of photodetectors (avalanche photodiode, p-i-n photodiode, etc.) and conversion electronics. Such an optical communication bar may be exclusively optical, or may be mixed with electrical signaling. For example, shorter distances may be using electrical signaling, whereas longer distances on optical signaling, as per requirement. Also, the waveguide may be flexible, allowing mechanical relief (from mechanical stress), or system integration (non-planar options), and till longer distance options. Such an optical communication bar may have a non-rigid waveguide 1850 (e.g. fiber like) that allows mechanical twisting. Such flexibility may allow turning, folding, etc., allowing more system options.

Referring again to FIG. 18A, a deserializer 1812, serializer 1814 structure may be utilized to achieve higher raw data rates in accordance with embodiments. In accordance with embodiments, yield can be enhanced further by providing alternative spare lanes 1820 between the deserializer 1812, serializer 1814. In case of failure on one lane, a spare can be switched on. For example, failures could be hard failures such as broken or shorted wires, or soft failures such as marginal wires, compared with other wires in the same link, leading to raising voltage for all lanes. The spare(s) lanes can be switched in, and a lower voltage may result, and thereby recover power, as the voltage can be lowered.

Referring now specifically to the cross-sectional side view of FIG. 18A, a 2.5D packaging implementation is provided where the communication bar 160 connects two logic chips 104. As shown, the communication bar 160 is encapsulated in an insulating material 1838 (e.g. molding compound) and routed with a redistribution layer (RDL) 1832. In the particular embodiment illustrated, the logic chips 104 are encapsulated in a molding compound 1840, with a redistribution layer (RDL) 1832 on the front sides of the logic chips 104. For example, RDL 1832 may be formed utilizing thin film processing techniques. Communication bar 160 may be mounted on the RDL 1832 with solder bumps 105 (e.g. micro bumps), which are optionally encapsulated with an underfill material 1830 between the communication bar 160 and RDL 1832. The insulating material 1838 is formed over the communication bar 160. The insulating material 1838 may then optionally be planarized, followed by formation of RDL 1834 and placement of solder bumps 105. In FIG. 18A only one direction is shown, but the link may be extended to both directions. In addition the capabilities in both directions may be identical, or different, as per application.

Still referring to FIG. 18A, in some embodiments, the 2.5D package structure 1835 may include conductive pillars 1836 extending between the RDLs 1832, 1834. For example, these may be formed in a pillar first technique, where the conductive pillars 1836 are plated, followed by application of the insulating material 1838, or in a pillar last technique, where vias are etched into the insulating material 1838 followed by deposition or growth of the conductive pillars 1836. Additionally, the communication bar 160 may also include through vias 166 for back side connection to RDL 1834.

As a cost saving option, use of the extra RDL 1832 and insulating material 1838 (e.g. molding compound) may be avoided. In the embodiment illustrated in FIG. 18B, the communication bar 160 or device may be attached directly to the outside of a routing layer 1839 (e.g. including multiple RDL and dielectric layers) on the solder bump 105 side (e.g. ball grid array, BGA, side). There may be some tradeoff in pin density. The communication bar 160 may still have options for TSV 166 and it connecting to the solder bumps 105.

In accordance with embodiments, the communication bar 160 may be passive, or include active silicon. Additionally, use of the communication bar 160 may create short connection lengths between routing in the communication bar 160 and logic chips 104 (e.g. on range of solder bump 105 size), which can lower voltage requirements for power gain. In additional simple coding can be used to improve effective bandwidth of the connections.

While the embodiment illustrated in FIG. 18A is specific to a 2.5D package structure 1835, embodiments are not so limited, and may be extended to other packaging solutions, such as CoW where signal density may be even higher. For example, logic chips 104 and communication bar 160 may be implemented into the various CoW structures of FIGS. 5-7 used for logic chip 104 connection.

In some aspects various cost control implementations may be included. For example, logic can be moved from the logic chip 104 to the communication bar 160 to reduce logic chip 104 cost. Additionally, the communication bar can include discrete extension section areas, tapered structure, or hammerhead structure to reduce silicon cost. FIG. 19 is a schematic top view illustration of an interfacing bar with hammer head shape in accordance with an embodiment. As shown, the interfacing bar may be a communication bar 160 connecting a plurality of logic chips 104. As described above, the communication bars 160 may have chip-to-chip connection 162 area reserved to interface with the logic chip 104 die-to-die in/out (I/O) area 1602. This area may be larger than area required for routing, or relocated logic. In an embodiment, the communication bar includes a head component 170, and an extension section 172 extending along the longitudinal length of the interfacing bar 160, with the head component 170 being wider than the extension section 172 For example, the extension section 172 may include repeaters, etc. In this manner, the amount of silicon cost can be reduced. In other embodiments, extension section 172 is passive, and not active.

FIG. 20 is a schematic top view illustration of an interfacing bar including relocated die logic in accordance with an embodiment. In one aspect, one of a kind logic on the active logic chip 104 can add up area, and it can be difficult to provide redundancy for such, particularly for active logic chip 104 such as SOC in contrast to arrayed elements like GPU that may be easier to provide spares with area efficiency. In accordance with embodiments, some of such logic 2010 can be relocated to the communication bar 160, where space may be available. This may increase yield of the logic chip 104. By way of example, the logic 2010 may include random logic (e.g. glue logic) that is not I/O intensive or very high power. In another implementation, essential logic is left for one component on the main logic area of a first logic die, while extra logic needed for a second component (e.g. spare) can be moved to the communication bar. In other embodiments, the repeating logic is left in the main logic chip 104. However, logic that is required once, or few times (not every instance of operation of logic chip 104), can be moved to the communication bar 160. Alternatively, such logic can be separate, but connected using a communication bar 160.

FIG. 21 is a schematic top view illustration of an interfacing bar active area in accordance with an embodiment. In accordance with some embodiments, the interfacing bar, or communication bar 160 may include a head component 170 to support chip-to-chip connections and solder bumps 105 (e.g. micro bumps), and an extension section 172. In some embodiments, these may be integral components, or discrete components. In an embodiment, the head component 170 and extension section 172 are encapsulated in an insulating material 174. Alternatively, the area illustrated as insulating material 174 in FIG. 21 may be inactive silicon. In some embodiments, it is possible to implement additional cost savings by separating the active silicon areas of the extension section into discrete active components 176. FIG. 22 is a schematic top view and corresponding cross-sectional side view illustration of an interfacing bar with multiple discrete active components 176 in accordance with an embodiment. Such a configuration may provide lower cost (by reducing active silicon area), scalable bandwidth bar without silicon changes (by increasing width of component 176 and reintegrating into a wider bar), lower power (by selecting appropriate technology and voltage, and possibly binned process corner components), improved power noise (by including decoupling capacitor in the bar). In an embodiment, the interfacing bar, or communication bar 160 includes one or more discrete head components 170 and one or more discrete active components 176 (e.g. active silicon chiplets), where the discrete head components 170 and the one or more discrete active components 176 are electrically coupled with a routing layer 180. In this aspect, the active silicon area can be significantly reduced. By way of example, component 176 may be a simple repeater, re-timer, or other more complex structure like cross-bar. Further, the communication bar may be two-port, point to point, or with several ports.

The discrete head component(s) 170 and the one or more discrete active components 176 may be (encapsulated) in an insulating layer 174. Various packaging methods may be utilized for the formation of the communication bar 160, including CoW, 2.5D packaging. The discrete head components 170 and discrete active components 176 may be bonded to the routing layer 180, for example with micro bumps (not illustrated), or alternatively, the routing layer 180 may be formed over encapsulated discrete head components 170 and discrete active components 176.

Up until this point interfacing bars have been described generally, with several specific examples made with reference to communication bars 160. It is to be understood that many of the ideas are equally applicable to both memory bars 150 and communication bars 160, though some differences may exist due to function. For example, communication bars 160 may be passive, and may be active, with a main activity being repeaters. Other area may not be as densely used, hence several cost savings implementations, though cost savings implementations may also be applicable for memory bars 150. Another distinction may be that memory bars 150 may support a physical interface (PHY)/controller that requires space. In addition, memory bars 150 may also include caching below, with routing on top. Thus, memory bar 150 silicon may be actively used, by comparison. Memory bars 150 may also include additional functions, devices such as memory compressors and decompressors, reliability enhancements (such as chip kill), controllers for non-volatile memory (as a memory expansion), and local processing elements (close to the memory).

Figure 23:
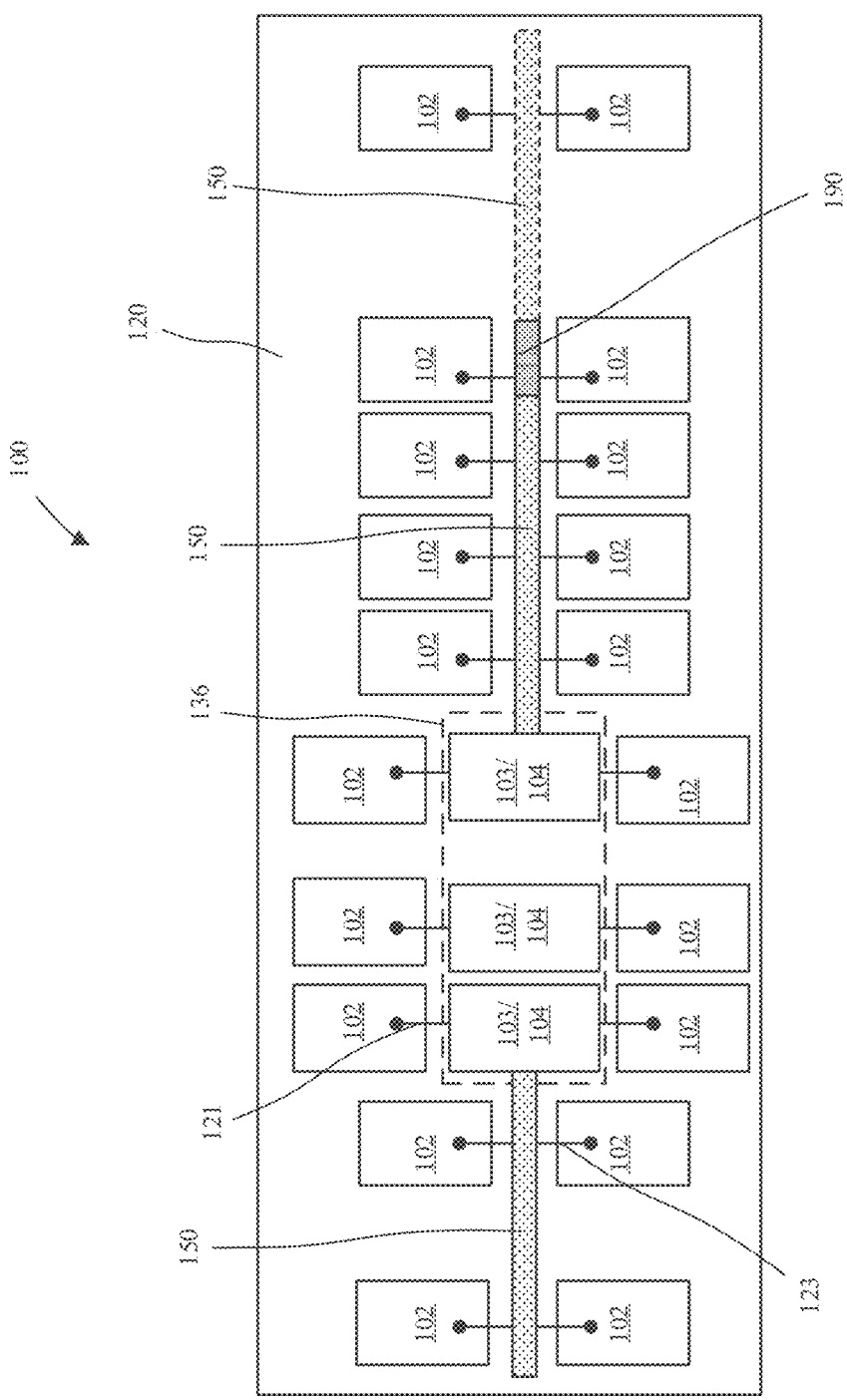
FIG. 23 is a schematic top view illustration of a scaled system including a memory bar bridge in accordance with an embodiment.

FIG. 23 is a schematic top view illustration of a scaled system 100 including a memory bar bridge 190 in accordance with an embodiment. In the exemplary embodiment, the system includes a plurality of chips and bars supported by a substrate 120 such as glass, silicon, interposer, etc. The system includes a first logic die 103 coupled with a second logic die 103, a first group of laterally separate memory chips 102 is connected with the first logic die 103 and a second group of memory chips 102 is connected with the second logic die 103. As described with regard to FIGS. 4-7, the logic dies 103 may be formed from the same piece of silicon, or be contained in separate logic chips 104. In an embodiment, the first and second logic dies 103 share the same silicon layer, and are interconnected with an on-chip routing 130, similarly as described with regard to FIG. 4. In an embodiment, the first and second logic dies 103 are discrete chips, and are connected with a shared wiring layer 136 (or interposer). For example, the shared wiring layer 136 may include a silicon bridge 140 that connects the first and second logic dies. The silicon bridge may be passive, or contain active silicon. In an embodiment, the first and second logic dies are logic chips 104 and are connected with a communication bar 160. For example, the communication bar can include a deserialzer 1812, a serializer 1814, and a plurality of repeaters (active devices 1822) between the deserializer and the serializer. The communication bar 160 may be a packaged component. In an embodiment, the communication bar 160 includes a discrete active component 176 (also covering a discrete active section 172) and a discrete head component 170 encapsulated in an insulating layer 174, and a routing layer 180 connecting the discrete active component 176 and the discrete head component 170.

In accordance with embodiments, scalable systems are described in which logic chip 104 perimeter to memory chips 102 is increased. Additionally, the systems may be scalable with high bandwidth, low latency, and with power and cost optimizations. Logic chip 104 perimeter can not only scaled by connecting multiple logic chips 104, but additionally with memory bars 105 for peripheral extension. In the embodiment illustrated in FIG. 23, some memory chips 102 may be directly routed to the logic chips 104 with routing 121. Memory capacity can also be expanded with memory bars 150, and routing additional memory chips 102 to the memory bars 150 with routing 123. Memory bars 150 may also be extended using high density bridges 190, which may resemble silicon chiplets with a wiring layer.

It is to be appreciated while the above description is made with regard to memory chips 102, it is understood that this term is inclusive of configurations including stacked memory dies, and memory packages. Thus, embodiments may be compatible with a variety of memories such as, but not limited to, LPDDR-x, HBM, HMC, etc.

The memory bars 150 in accordance with embodiments may support a physical interface (PHY)/controller with the logic die 104 that requires space. In addition, memory bars 150 may also include caching below, with routing on top. Memory bars 150 may also include additional functions, devices such as memory compressors and decompressors, reliability enhancements (such as chip kill), controllers for non-volatile memory (as a memory expansion), and local processing elements (close to the memory). In accordance with embodiments, a memory bar 150 may provide level shifting capabilities as required.

In a specific embodiment, the memory bars 150 may include error-correcting code (ECC) for enhanced reliability, availability, and serviceability (RAS). Specifically, ECC may correct memory chip 102 errors due to soft errors such as electrical or magnetic interference that causes a single bit of dynamic random-access memory (DRAM) to spontaneously flip to the opposite state. By comparison, conventional LPDDR-x memory systems may not include ECC on external I/O. The memory bars 150 in accordance with embodiments may store the ECC data, which can be combined with main data from the DRAM (e.g. memory chips 102). A parity or cyclical redundancy check (CRC) of the data can also be stored on the memory bars 150. These may help detect an error. On error, the data can be re-requested from memory. In an embodiment, a partial memory can be ECC protected (e.g. operating system, critical software), while others are parity or CRC protected.

Figure 24:
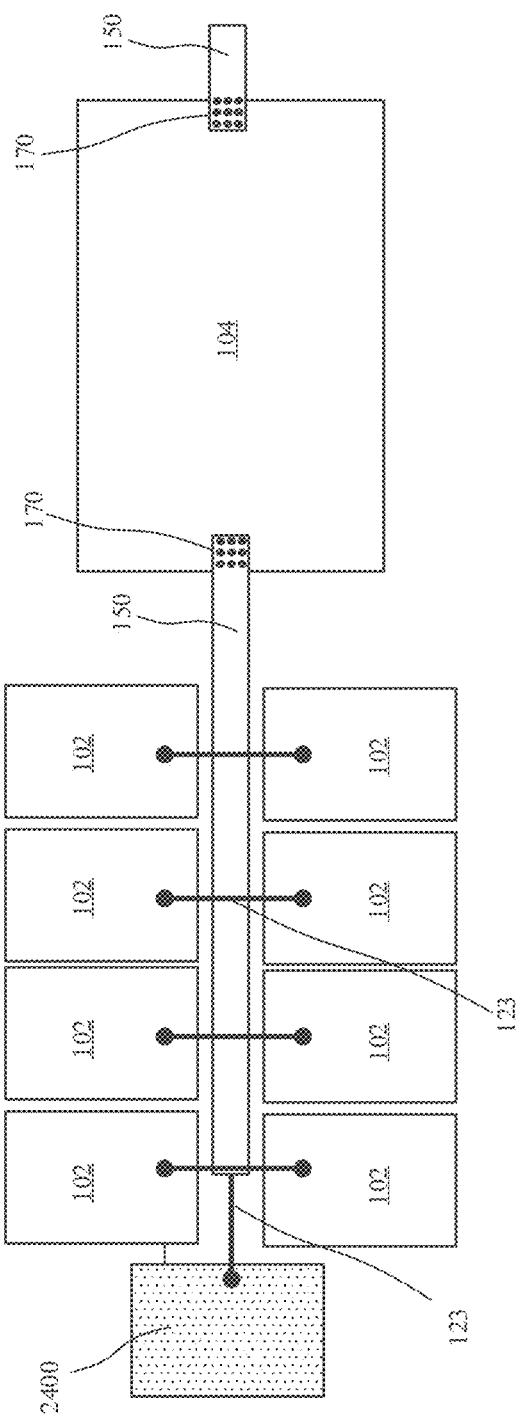
FIG. 24 is a schematic top view illustration of a scaled system including an extension area in accordance with an embodiment.

In accordance with embodiments, the system may include routing 123 to an extension area for a miscellaneous component 2400, as illustrated in FIG. 24. Extension to a variety of miscellaneous components 2400 are possible, such as spare memory, alternative memory extension, and spare die or variable retention time (VRT) support. In an embodiment, a miscellaneous component 2400 is a spare memory chip 102 or package for yield and RAS. A spare lane (or channel) set may be provided in the active logic chip 104 and memory bar 150 to provide full redundancy of a memory chip 102 or package. In such an embodiment, the system can be tested after assembly for failed dies, chips, packages. If a specific memory die or lane (or channel) is detected, a replacement can be populated. Alternatively, a full memory chip 102 or package can be added. Additionally, the spare component can be originally populated during assembly. The spare component is activated during testing, and recorded. The controller then maps the failing device/chip and maps the spare component to the failed device/chip.

In an embodiment, miscellaneous component 2400 is a spare die to help VRT check. Thus, the spare die can be used to detect potential DRAM errors, and take appropriate action. In such an embodiment, the application data is located in the spare die. A vacated memory chip 102 (DRAM) is VRT tested, and potentially flagged so that the device can be quarantined, repaired, or vacated partially. Alternatively, the tested memory chip 102 is kept cooler, to help maintain retention time, margins.

In an embodiment, miscellaneous component 2400 is an alternative memory component for memory extension. For example, the alternative memory component may be a non-volatile memory (NVM) such as, but not limited to flash memory and phase change memory (PCM). The memory bar 150 may include interfaces/logic to support NVM that may provide for significantly increased capacity for uses such as program code storage, static storage etc. NVM may additionally be less expensive, though also slower and less reliable. In an embodiment, the NVM may have strict write or read occurrences (such as once per day) or wear out restrictions. In an embodiment, this NVM can provide for quick checkpoint service (under operating system/software control). Once prompted, all the memory contents can be pulled, and stored into NVM. In another use may be for expansive memory for search engines (where reads are favored over writes), where less information can reside there. Although, a long memory bay may have longer latency to the end, and use more power. However, the average latency and power may be pertinent to many applications. Also the software, or a logic on memory bar (or controller), can allocate memory such that in general, frequently used memory lines/pages/blocks can be closer to the logic chip (e.g. SOC), whereas less frequently used lines are further away.

Figure 27:
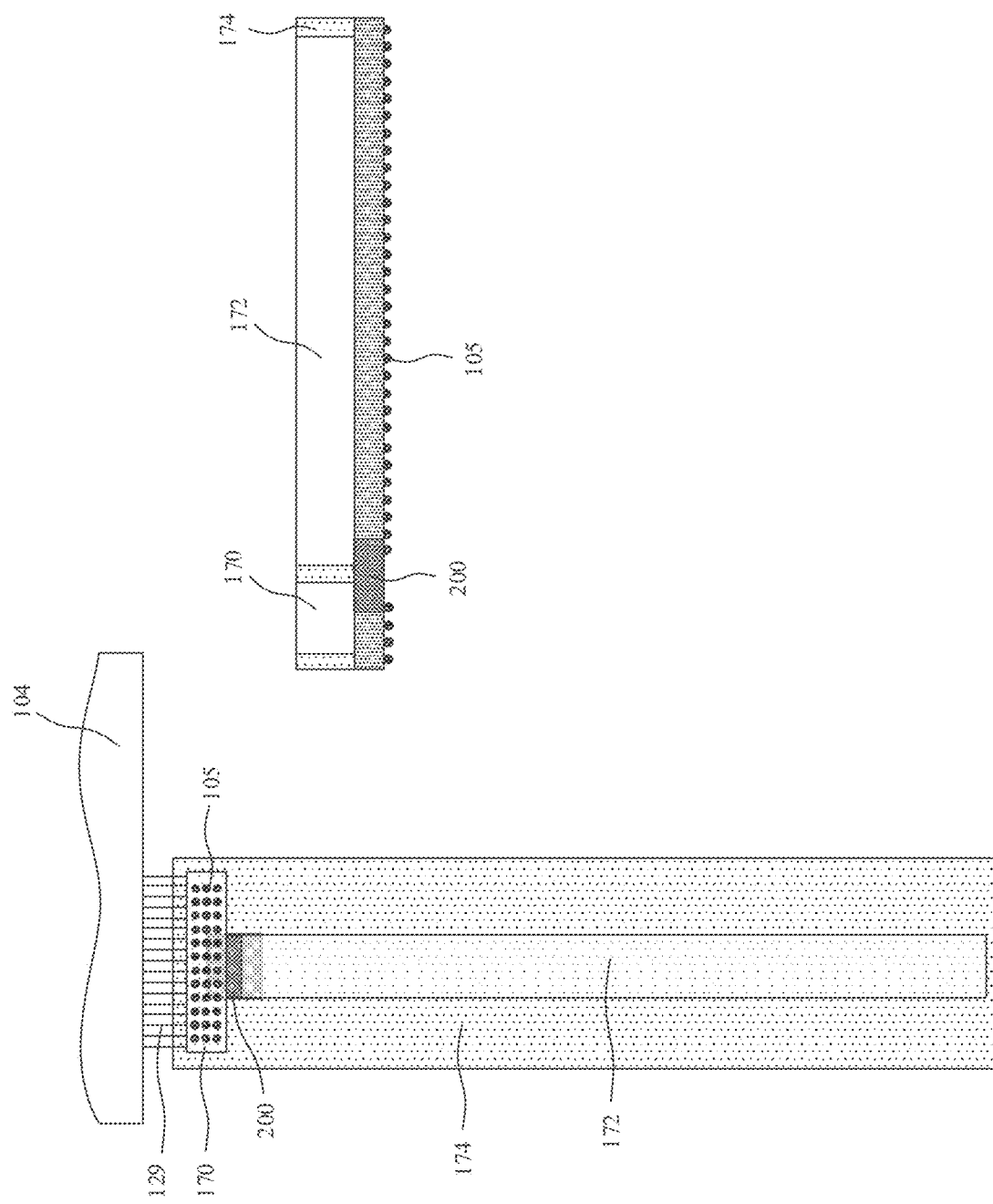
FIG. 27 is a schematic top view and cross-sectional side view illustration of an interfacing bar with discrete active and head regions in accordance with an embodiment.

In accordance with embodiments various cost control solutions may be implemented into the interfacing bar, or memory bar 150 design. FIGS. 25-26 are schematic top view illustrations of an interfacing bar with different form factors in accordance with embodiments. FIG. 25 is an illustration of a hammerhead memory bar 150 similar to that previously described and illustrated for the communication bar 160 in FIG. 19. As shown, the memory bar 150 may include a head component 170 and extension section 172 extending from the head component 170 along a longitudinal length of the memory bar. The hammerhead structure may optimize silicon area, and avoid choke point for high I/O density, with the head component 170 being wider than the extension section 172. FIG. 26 is an illustration of a tapered memory bar 150 design, that may save silicon cost. In such a configuration, width of the extension section 172 tapers down along the longitudinal length. This may be justified due to the decreasing number of interfaces, lanes/channels, and logic required as the memory chips 102 are serviced along the longitudinal length. In an embodiment, the routing layer 1510 (see FIG. 15) includes at least a lower wiring layer $M_A$ and upper wiring layers $M_D$. The routing layer 1510 may extend a substantial portion of a longitudinal length of the memory bar. As illustrated, the wiring layers may optionally have different thicknesses, with $M_D$ being the thickest, and $M_A$ being the thinnest. The memory chips 102 located furthest away from the active logic chip 104 may be electrically coupled to the active chip through a first wire running a substantial distance of the longitudinal length in upper wiring layer $M_D$, while the chips 102 located closer to the active logic chip 104 may be electrically coupled to the active chip through a second wire in the lower wiring layer $M_A$ FIG. 27 is a schematic top view and cross-sectional side view illustration of an interfacing bar with discrete active and head regions in accordance with an embodiment. In accordance with some embodiments, the interfacing bar, or memory bar 150 may include a head component 170 to support PHY connection with the logic chips 104 and solder bumps 105 (e.g. micro bumps), hybrid bond, anisotropic conductive film (ACF), high density metal to metal bond (CoW) or other high density attach, and an extension section 172. In some embodiments, these may be integral components, or discrete components. In an embodiment, the head component 170 and extension section 172 are encapsulated in an insulating material 174. Alternatively, the area illustrated as insulating material 174 in FIG. 27 may be inactive silicon. The head component 170 can be coupled with the logic chip 104 with routing 129, which may optionally be located on substrate 120. In a similar configuration, as shown and described with regard to FIG. 30, the components of the memory bar 150 may be arranged in an L-shaped configuration.

Various packaging methods may be utilized for the formation of the memory bar 150, including CoW, 2.5D packaging. The discrete head components 170 and discrete extension section 172 may be bonded to a routing layer 180, for example with micro bumps (not illustrated), hybrid bond, anisotropic conductive film (ACF), high density metal to metal bond (CoW) or other high density attach, or alternatively, the routing layer 180 may be formed over encapsulated discrete head components 170 and discrete active components 176.

Figure 28:
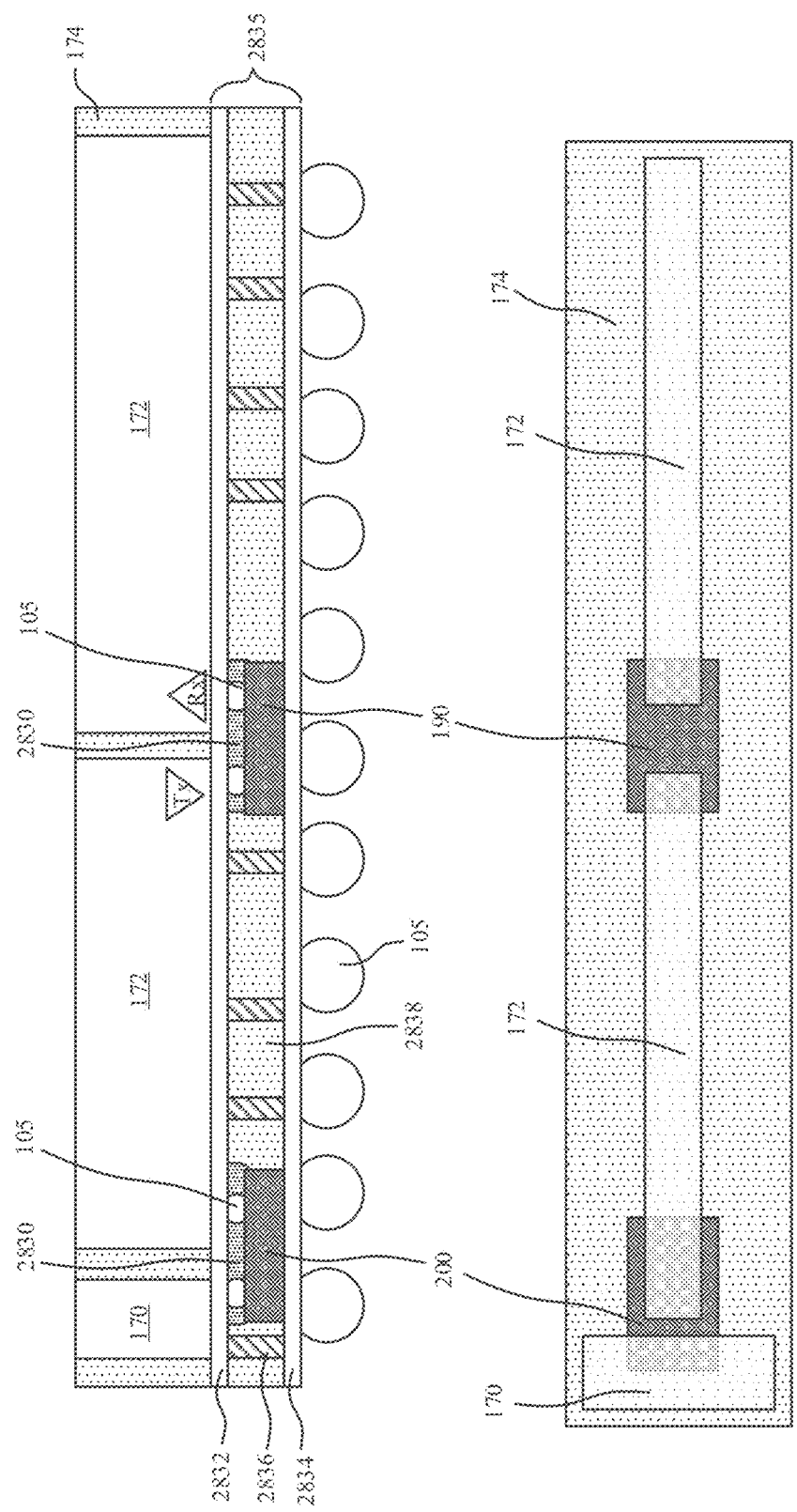
FIG. 28 is a schematic top view and cross-sectional side view illustration of an interfacing bar package in accordance with an embodiment.

Referring now specifically to FIG. 28, the routing layer 180 of FIG. 22 may be a 2.5D package structure 2835 including a high density bridge 200, and optionally one or more high density bridges 190. As shown, the head component 170 and one or more active regions 172 are encapsulated in an insulating material 174 (e.g. molding compound) and optionally routed with a redistribution layer (RDL) 2832. In the particular embodiment illustrated, the high density bridges 200, 190 are encapsulated in an insulating material 2838, with an optional redistribution layer (RDL) 2832 connecting the head component 170, extension section(s) 172, and high density bridges 200, 190. For example, RDL 2832 may be formed utilizing thin film processing techniques. The high density bridges 200, 190 may be mounted on the RDL 2832 using a suitable technique such as, but not limited to, solder bumps 105 (e.g. micro bumps), which are optionally encapsulated with an underfill material 2830 between the high density bridges 200, 190 and RDL 2832. The insulating material 2838 is formed over the communication bar 160. The insulating material 1838 may then optionally be planarized, followed by formation of optional RDL 2834 and placement of solder bumps 105.

Still referring to FIG. 28, in some embodiments, the 2.5D package structure 2835 may include conductive pillars 2836 extending between the RDLs 2832, 2834. For example, these may be formed in a pillar first technique, where the conductive pillars 2836 are plated, followed by application of the insulating material 2838, or in a pillar last technique, where vias are etched into the insulating material 2838 followed by deposition or growth of the conductive pillars 2836. While the embodiment illustrated in FIG. 28 is specific to a 2.5D package structure 2835, embodiments are not so limited, and may be extended to other packaging solutions, such as CoW. Further high density bridges 200, 190 may also support through silicon vias.

The multi-chip systems in accordance with embodiments may be assembled with a variety of packaging solutions. Referring briefly back to FIGS. 2-3, the system 100 can include a multi-chip module (MCM) with glass core substrate 120 CTE matched with silicon, for example, to keep mismatch with the logic chips 104 and memory chips 102 in the composite topology small, and allow fine pitch flip chip integration, allow thinner core for substrate 120, and reduce overall z-height. Furthermore, the flex circuit 112 to board 106 can reduce z-height by reducing or eliminating heights due to ball grid array (BGA) attachment. This additionally avoids BGA attach thermal temperatures, and warpage associated with BGA. The stiffener 122 may additionally improve warpage at low temp, and warpage associated with handling.

Figure 29A:
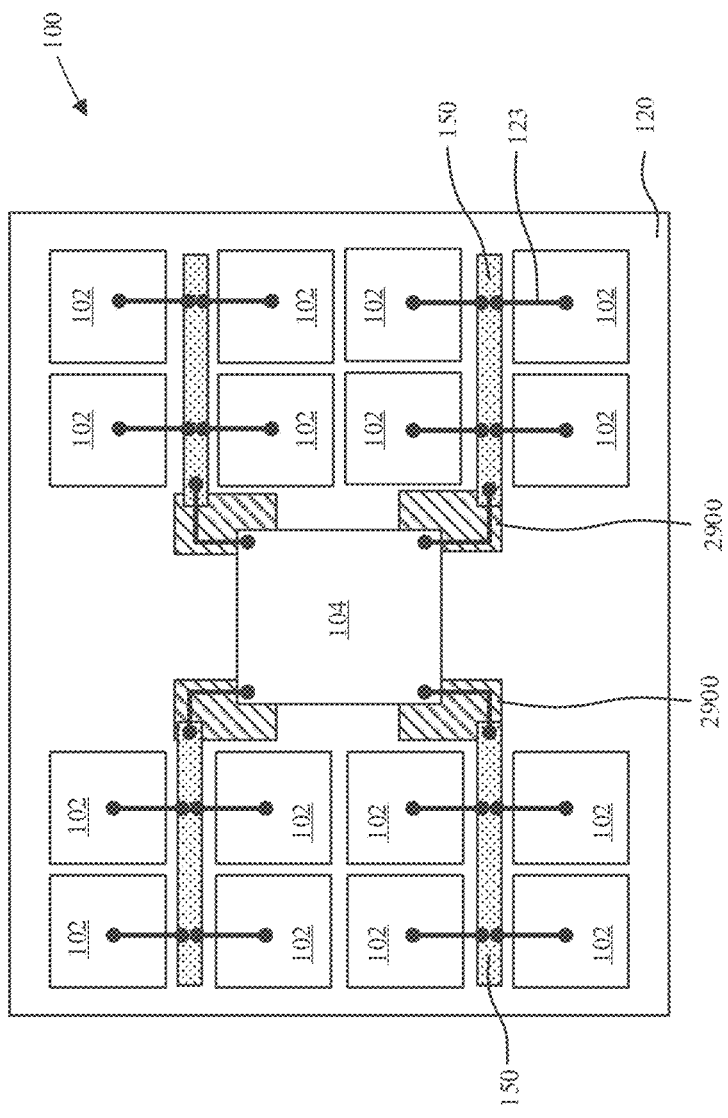
FIG. 29A is a schematic top view illustration of a scaled system with a bridge connecting a logic chip to memory bar in accordance with an embodiment.
Figure 29B:
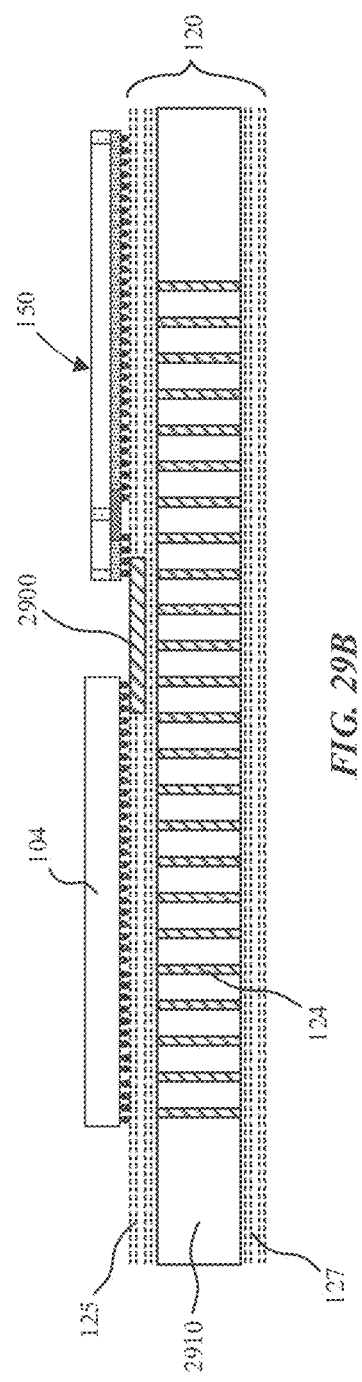
FIG. 29B is a schematic cross-sectional side view illustration of the scaled system of FIG. 29A in accordance with an embodiment.

Referring now to FIGS. 29A-29B schematic top view and cross-sectional side view illustrations of a scaled system with a bridge connecting a logic chip to memory bar are provided in accordance with an embodiment. As shown, the system may include a substrate 120, such as a MCM substrate. For example, the substrate 120 may optionally include a core 2910 (e.g. glass core), top routing layers 125, optional bottom routing layers 127, and optional through vias 124 extending between the top routing layers 125 and bottom routing layers 127. Substrate 120 may be formed of a variety of materials such as but not limited to, glass, silicon, interposer, matched metal stabilized substrate, etc. Core 2910 may be formed of a variety of materials such as, but not limited to, glass core, metal core, etc. As shown, a bridge 2900 (e.g. local high density bridge) may be located within the routing layer 125, with the logic chip 104 and memory bar 150 being mounted on the routing layer 125

(e.g. using flip chip, and solder bumps), and the bridge 2900 electrically couples the logic chip 104 and memory bar 150. This may be direct coupling, and/or with additional wiring in the routing layer 125. Such a configuration may be used to improve connectivity (e.g. bandwidth, power complexity) of the substrate 120. As shown in FIG. 29A, the memory bar 150 may couple a plurality of memory chips 102 are mounted on the routing layer 125 and electrically coupled with the memory bar 150 with routing 123 in the routing layer 125. In an embodiment, the bridge 2900 (e.g. high density bridge) includes an active component. For example, the bridge may include active silicon.

Figure 30:
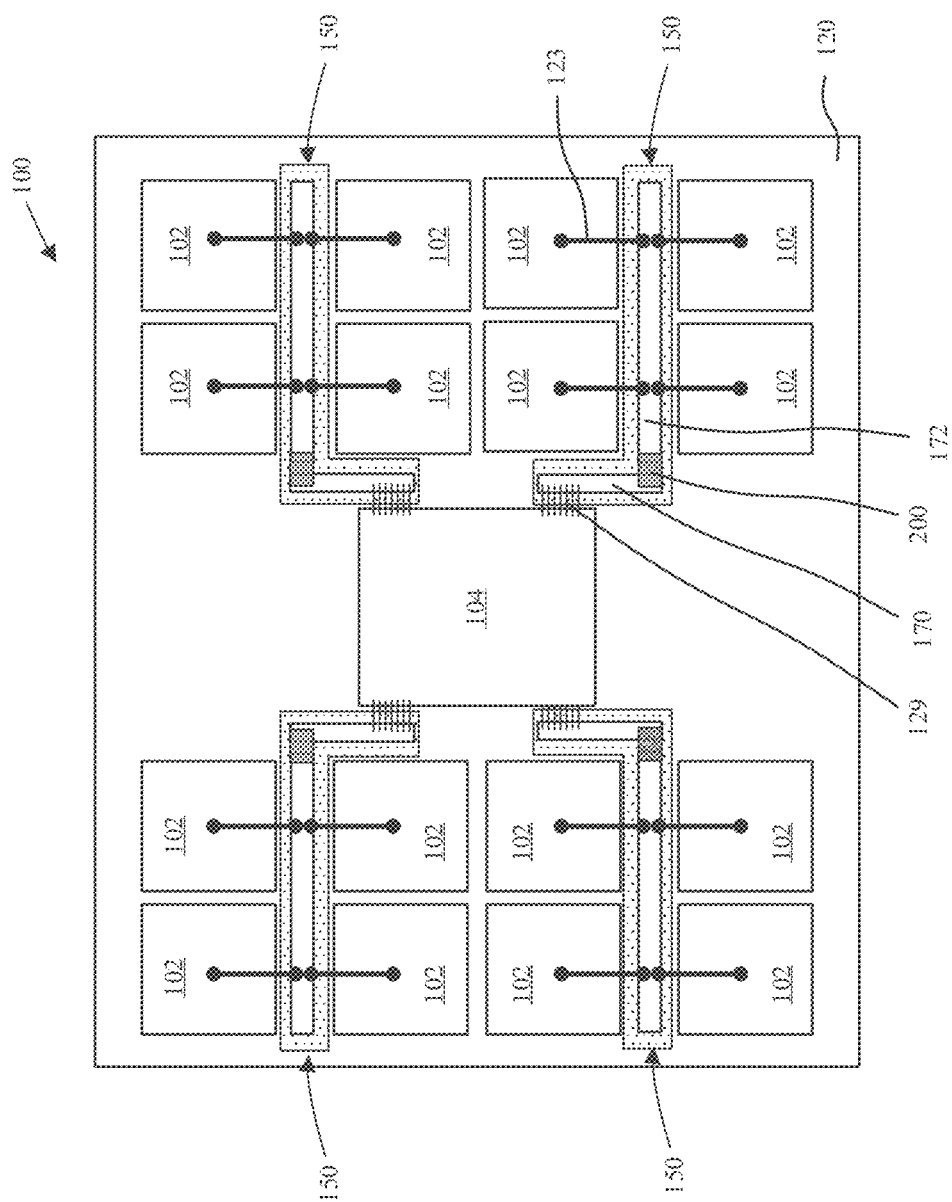
FIG. 30 is a schematic top view illustration of a scaled system with board routing connecting a logic chip to memory bar in accordance with an embodiment.

FIG. 30 is a schematic top view illustration of a scaled system 100 with substrate routing 129 in routing layer 125 connecting a logic chip 104 to memory bar 150 in accordance with an embodiment. Thus, routing on the substrate 120 is used for electrical connection to the memory bar 150 as opposed to the bridge 2900 of FIGS. 29A-29B. As shown in FIG. 30, the logic chip 104 and memory bar 150 are mounted on the routing layer 125 (e.g. using flip chip, and solder bumps) and are electrically coupled by routing 129 in the routing layer 125. Similarly, a plurality of memory chips 102 may be mounted on the routing layer 125 and electrically coupled with the memory bar 150 by routing 123 in the routing layer 125. The particular embodiment illustrated may be directed to the 2.5D packaging of the memory bar 150, though this can also be fabricated utilizing CoW like attach. For example, the micro-bumps used to attach the memory bar 150 can be replaced by hybrid bonds, which can be denser. The dielectric for hybrid bonding may be oxide based. An example, is similar to FIG. 12A. CoW like attach may also support hammerhead or tapered structures as appropriate.

In particular, the memory bars 150 illustrated in FIG. 30 may be formed using a 2.5D packaging configuration similar to that illustrated and described with regard to FIG. 27, including a head component 170, extension section 172, and high density bridge 200. Notably, the components may be arranged in an L-shaped configuration, which can increase the logic die 104 perimeter, improve packing density of the memory chips 102, and therefore lower cost of the memory bars 150. In addition, the vertically oriented head components 170 increase area between the logic die 104 edge and head components 170, which can allow integration of more routing 129 wires, and higher bandwidth.

Figure 31A:
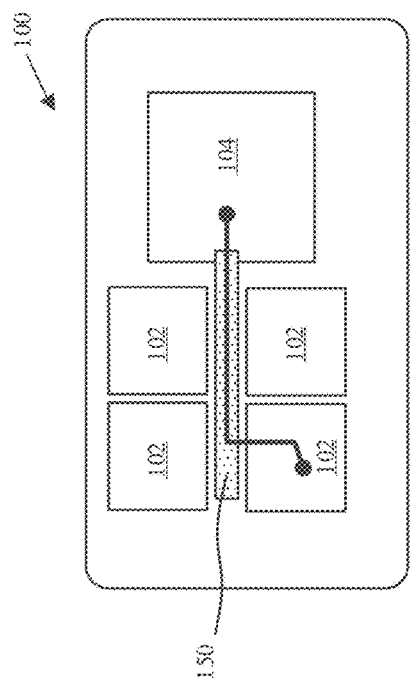
FIG. 31A is a schematic top view illustration of a package on package scaled system in accordance with an embodiment.
Figure 31B:
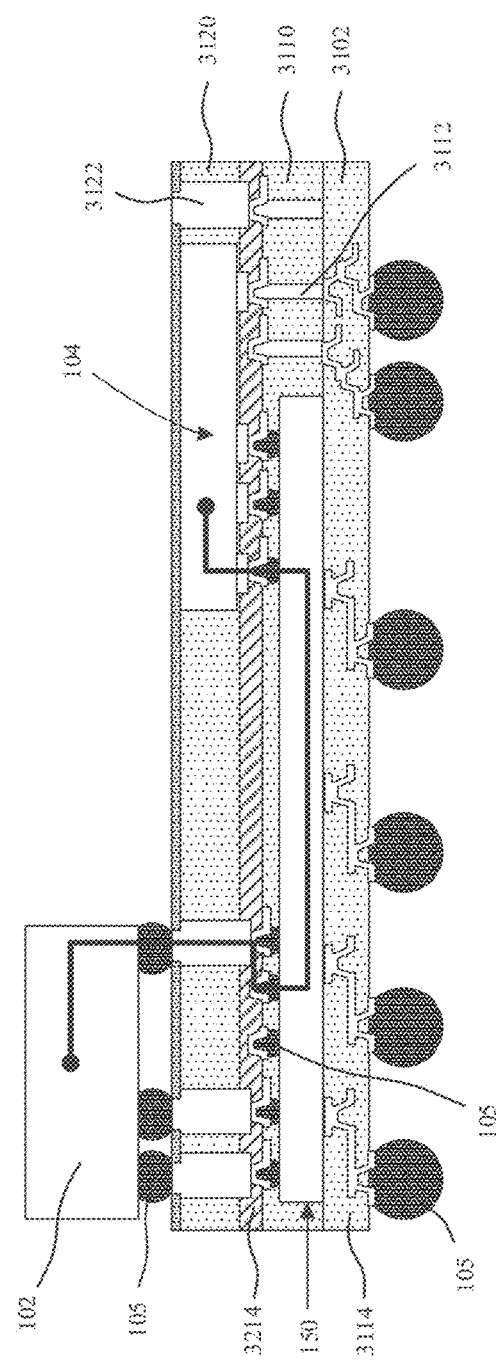
FIGS. 31B-31C are schematic cross-sectional side view illustrations of various package on package scaled systems in accordance with an embodiment.
Figure 31C:
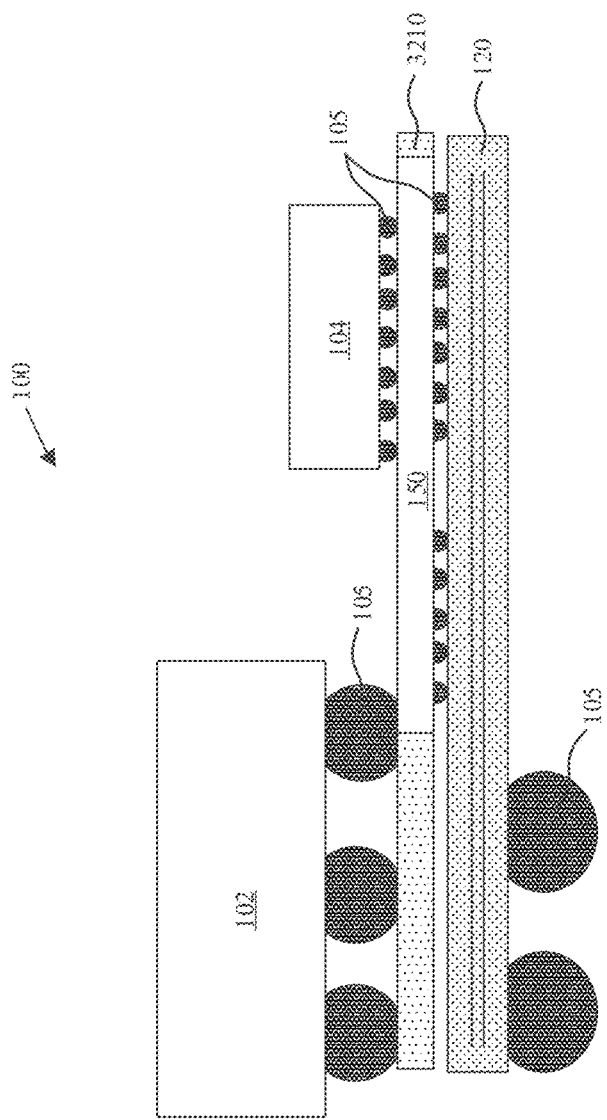

Referring now to FIGS. 31A-31C various 2.5D package on package (PoP) configurations are shown for the scaled system. FIG. 31A is a schematic top view illustration of a PoP scaled system in accordance with an embodiment, while FIGS. 31B-31C are cross-sectional side view illustrations of different implementations taken along the routing (arrow) shown in FIG. 31A. In particular, the embodiment illustrated in FIG. 31B may replace or be used in combination with substrate 120. The embodiment illustrated in FIG. 31C may be used in combination with substrate 120. Referring specifically to FIGS. 31A-31B the system 100 includes a lower RDL 3102, a first molding layer 3110 on the lower RDL 3102, and the memory bar 150 is encapsulated in the first molding layer 3110. A second RDL 3124 may be formed over the encapsulated memory bar 150 and first molding layer 3110. In an embodiment, the memory bar 150 is flip chip bonded with solder bumps 105 to the second RDL 3124. A second molding layer 3120 is over the second RDL 3124 and the first molding layer 3110, and the logic chip 104 may be encapsulated in the second molding layer 3120. A plurality of through vias 3112 may connect the lower RDL 3102 and second RDL 3124. Additionally, a second plurality of through vias 3122 may be formed through the second molding layer 3120. In the embodiment illustrated, a plurality of memory chips 102 is mounted on top of the second molding layer 3120. The plurality of memory chips 102 may be electrically coupled to the logic chip 104 through the memory bar 150, and the plurality of through vias 3122. As described herein, memory chips 102 may be single memory device, stack, or module.

Referring now to FIGS. 31A and 31C, in an embodiment, the system includes a memory bar 150 encapsulated in a first molding layer 3210. The logic chip 104 and a plurality of memory chips 102 are all mounted on top of the second molding layer. For example, they may be connected with the memory bar 150, and optionally an RDL formed on the first molding layer 3210. A bottom RDL may also be optionally formed underneath the first molding layer 3120 and encapsulated memory bar 150. The encapsulated structure may optionally be bonded, for example using flip chip and solder bumps 105, to a substrate 120. As shown in FIG. 31C, in such a configuration the height of the logic chip 104 and memory chips 102 is not additive, which can facilitate a low z-height packaging configuration.

In accordance with embodiments, the interfacing bars 1500 such as communication bars 160 and memory bars 150 can be combined to form a scaled memory system, and packaged using the previously described and illustrated configurations. For example, referring again to FIGS. 13-14, in an embodiment, a memory system includes a first logic chip 104, a second logic chip 104, and a communication bar 160 that couples the first and second logic chips 104. A first memory bar 150 is coupled with the first logic chip 104, and a second memory bar 150 is coupled with the second logic chip 104. A first group of laterally separate memory chips 102 is coupled with the first memory bar 150, and a second group of laterally separate memory chips 102 is coupled with the second memory bar 150.

The memory bars may also be bridged. For example, referring again to FIG. 23, the system may additionally include a third memory bar 150, and a third group of laterally separate of memory chips 102 coupled with the third memory bar 150. In addition, a bridge 190 couples the second memory bar 150 to the third memory bar 150. In other configurations, such as that illustrated in FIG. 28, the memory bar 150 may include multiple extension sections 172 coupled with one or more bridges 190.

In accordance with embodiments, the first and second logic chips 104, and the first and second groups of laterally separate memory chips 102 can be mounted on a substrate 120. While illustrated as rectangular herein, it is understood that substrate may have any suitable shape. As shown in FIGS. 2-3, the substrate 120 may be coupled with a board 106 with a flex circuit 112. As described herein the communication bars 160 and memory bars 150 can be independently packaged, or packaged along with the system. In specific embodiment such as FIGS. 29A-29B and FIG. 30, the first and second memory bars 150 are mounted on the substrate 120. In other embodiments, such as the 2.5D-PoP structures illustrated in FIG. 31B-31C, the first and second memory bars 150 are encapsulated in a first molding layer, the first and second logic chips 104 are mounted on top of the first molding layer, and the first and second groups of laterally separate memory chips 102 are mounted on top of the first molding layer 3120, and the first and second groups of laterally separate memory chips 102 are mounted on top of the first molding layer.

Figure 32A:
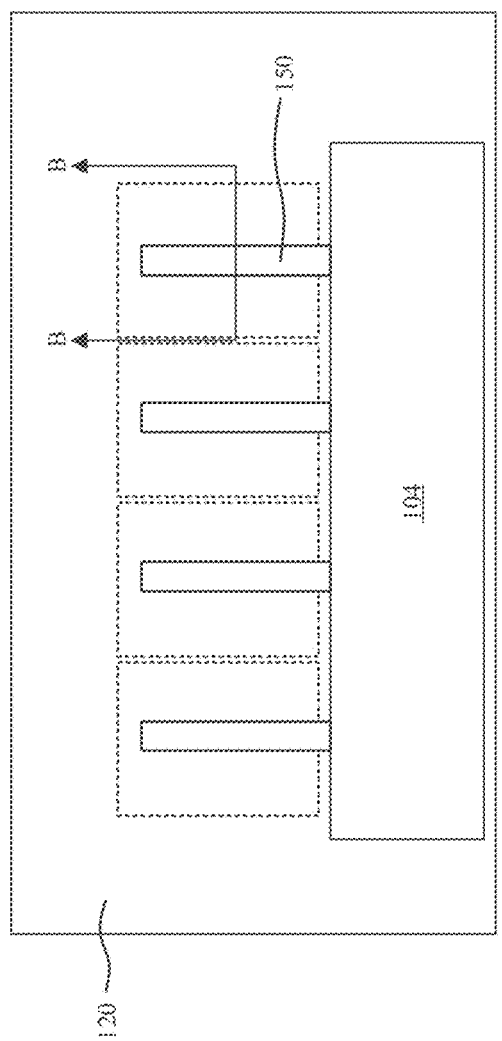
FIG. 32A is a schematic top view illustration of a 3D scaled system in accordance with an embodiment.
Figure 32B:
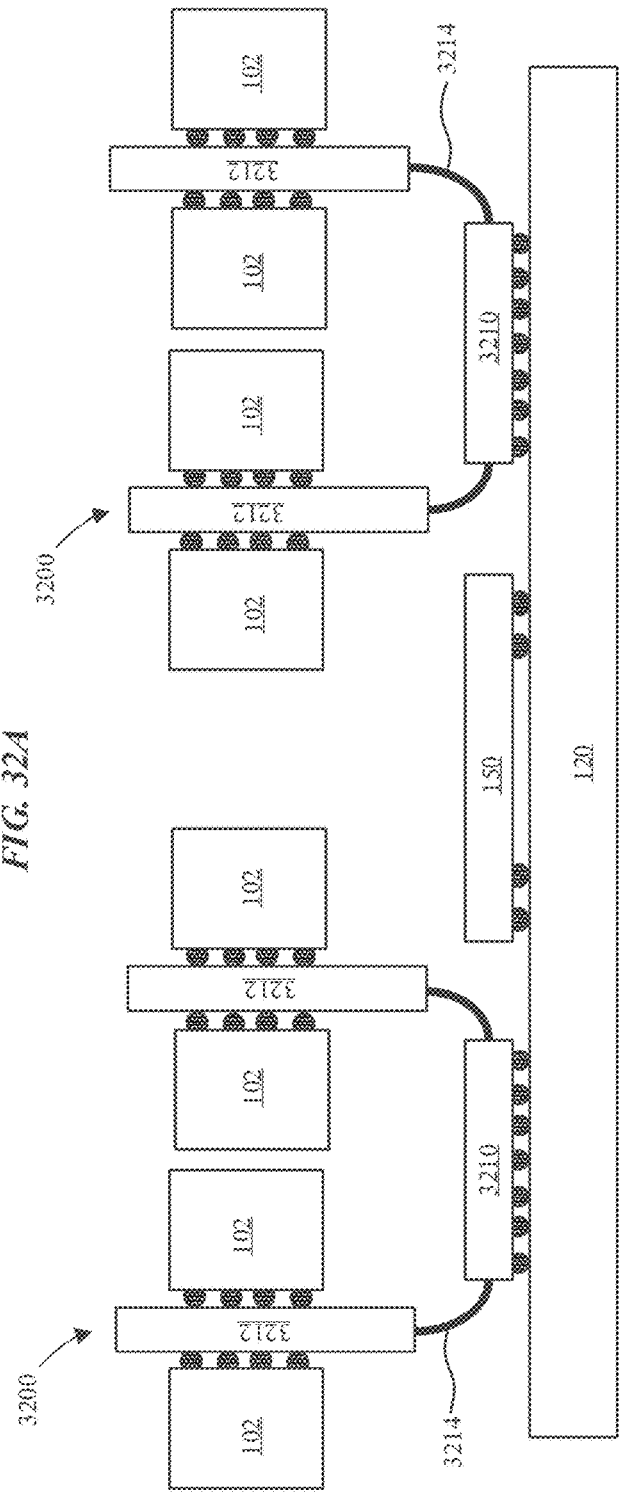
FIG. 32B is a schematic cross-sectional side view illustration taken along line B-B of FIG. 32A in accordance with an embodiment.

FIG. 32A is a schematic top view illustration of a 3D scaled system in accordance with an embodiment. FIG. 32B is a schematic cross-sectional side view illustration taken along line B-B of FIG. 32A in accordance with an embodiment. As shown, a semi-rigid flex circuit 3200 including a base portion 3210 (e.g. base board) and one or more side portions 3212 (e.g. side boards) can be connected by flex connections 3214 that provide horizontal to vertical conversion. The base portions 3210 can be mounted on substrate 120 using a suitable technique such as, but not limited to, micro bumps. Memory chips 102 may be mounted on one, or both sides (as illustrated) of the side portions 3212. Such a 3D arrangement may increase memory capacity significantly, with some correlated z-height addition to the system. In other embodiments, more rigid 3D structures may be used, for example, similar to dual in line memory modules (DIMM), with pin connections, sockets, etc. In some embodiments, the flex connection 3214 can fold further, such that the memory chips (devices) 102 are now parallel to the substrate 120, and memory chips (devices) 102 are now stacked on the base portion 310. This configuration can help keep z-height under control, which increasing memory capacity.

In the above description, various multi-chip system 100 configurations are described in which a large substrate 120 may be effectively CTE matched with multiple chips, modules, bars mounted on, or assembled within, the substrate 120. These configurations may provide mechanical reliability. Such substrate 120 may additionally provide foundation for mechanical handling, and thermal solution attachment.

In such large systems cooling may be an important factor. Cooling plates, two phase (e.g. heat pipes), liquid cooled, loop heat pipe, and micro-channel are possible options. Other options may include immersion in liquid (such as mineral oil, custom hydrocarbons, or others) may be considered. Further the liquid may be chilled, since memory power can be high, cooling solution can be extended to cover that.

Exemplary substrates 120 can be glass-cored organic, metal stabilized core (such as copper invar copper or molybdenum (with CTE match, and higher Young's modulus) substrate) or CTE matched glass or organic material. Such large substrates 120 may be mechanically or weakly coupled with other substrates, such as board 106 by either socket, soft-solder, flex circuit, etc. Such CTE matched substrates 120 may also lower thickness of the system, keeping z-height small. With larger substrates 120 additionally mechanical stiffener(s) 122 may be strategically added at its surface locations as appropriate to enhance rigidity for mechanical handling capability and reduced warpage. The stiffener(s) 122 may be metals, package substrate core or other high elastic modulus materials with proper CTE.

In utilizing the various aspects of the embodiments, it would become apparent to one skilled in the art that combinations or variations of the above embodiments are possible for forming a scaled system. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:
1. A multi-chip system comprising:
a first chip;
an interfacing bar coupled with the first chip; and
a second chip coupled with the interfacing bar along a longitudinal length of the interfacing bar; and
a third chip coupled with the interfacing bar along the longitudinal length of the interfacing bar, wherein the second chip is coupled with the interfacing bar along the longitudinal length of the interfacing bar further away from the first chip than the third chip.

2. The multi-chip system of claim 1, the interfacing bar comprises a routing layer extending a substantial portion of a longitudinal length of the interfacing bar.

3. The multi-chip system of claim 2, wherein:
the routing layer of the interfacing bar comprises a plurality of metal layers including a lower wiring layer and an upper wiring layer characterized by wider wiring than the lower wiring layer; and
the second chip is electrically coupled with the first chip through a first wire running a substantial distance of the longitudinal length in upper wiring layer, and the third chip electrically is coupled with the first chip through a second wire in the lower wiring layer, wherein the first wire is wider than the second wire.

4. The multi-chip system of claim 2, wherein the interfacing bar comprises a discrete head component and one or more discrete active components, wherein the discrete head component and the one or more discrete active components are electrically coupled with the routing layer.

5. The multi-chip system of claim 4, wherein the discrete head component and the one or more discrete active components are in an insulating layer.

6. The multi-chip system of claim 2, further comprising a second interfacing bar, a plurality of additional chips coupled with the second interfacing bar, and a bridge that couples the interfacing bar to the second interfacing bar.

7. The multi-chip system of claim 2, wherein the interfacing bar comprises a head section and an extension section extending along the longitudinal length of the interfacing bar, wherein the head section is wider than the extension section.

8. The multi-chip system of claim 1, wherein the interfacing bar comprises a deserializer, a serializer, and a plurality of repeaters between the deserializer and the serializer.

9. The multi-chip system of claim 1, wherein the interfacing bar is an optical interconnect bar.

10. The multi-chip system of claim 9, wherein the optical interconnect bar includes an electrical-to-optical converter component and an optical-to-electrical converter component.

11. The multi-chip system of claim 1, further comprising:
a substrate including a routing layer, and a high density bridge within the routing layer;
wherein the first chip is mounted on the routing layer, the interfacing bar is mounted on the routing layer, and the first chip and the interfacing bar are electrically coupled with the high density bridge within the routing layer.

12. The multi-chip system of claim 11, wherein the high density bridge includes an active device.

13. The multi-chip system of claim 11, wherein an additional plurality of chips are mounted on the routing layer, and electrically coupled with the interfacing bar with routing in the routing layer.

14. The multi-chip system of claim 11, wherein the substrate is characterized by a composite coefficient of thermal expansion (CTE) that is matched within +/−4 ppm/C of an effective CTE of a composite topology including the first chip, the interfacing bar, and the second chip.

15. The multi-chip system of claim 14, wherein the substrate is coupled with a board with a flex circuit.

16. The multi-chip system of claim 1, further comprising:
a substrate including a routing layer;
wherein the first chip is mounted on the routing layer, the interfacing bar is mounted on the routing layer, and the first chip and the interfacing bar are electrically coupled by the routing layer.

17. The multi-chip system of claim 16, wherein the second chip, the third chip and an additional plurality of chips are mounted on the routing layer and electrically coupled with the interfacing bar by the routing layer.

18. The multi-chip system of claim 17, wherein the substrate is characterized by a composite coefficient of thermal expansion (CTE) that is matched within +/−4 ppm/C of an effective CTE of a composite topology on the substrate including the first chip, the interfacing bar, and the second chip.

19. The multi-chip system of claim 18, wherein the substrate is coupled with a board with a flex circuit.

20. The multi-chip system of claim 1, further comprising:
a lower redistribution layer (RDL);
a first molding layer on the lower RDL, wherein the interfacing bar is encapsulated in the first molding layer;
a second molding layer on the first molding layer, wherein the first chip is encapsulated in the second molding layer; and
wherein the second chip, the second chip and an additional plurality of chips are mounted on top of the second molding layer.

21. The multi-chip system of claim 1, further comprising a first molding layer, wherein the interfacing bar is encapsulated in the first molding layer, the first chip is mounted on top of the first molding layer, and the second chip, and an additional plurality of chips are mounted on top of the second molding layer.

* * * * *